US011520050B2

(12) United States Patent
Iguchi et al.

(10) Patent No.: US 11,520,050 B2
(45) Date of Patent: Dec. 6, 2022

(54) THREE-DIMENSIONAL IMAGE ELEMENT AND OPTICAL RADAR DEVICE COMPRISING AN OPTICAL CONVERSION UNIT TO CONVERT SCANNED PULSE LIGHT INTO FAN-LIKE PULSE LIGHT

(71) Applicant: SHARP KABUSHIKI KAISHA, Sakai (JP)

(72) Inventors: Katsuji Iguchi, Sakai (JP); Koji Takahashi, Sakai (JP); Hidenori Kawanishi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 576 days.

(21) Appl. No.: 16/617,482

(22) PCT Filed: Apr. 18, 2018

(86) PCT No.: PCT/JP2018/015939
§ 371 (c)(1),
(2) Date: Nov. 26, 2019

(87) PCT Pub. No.: WO2018/221048
PCT Pub. Date: Dec. 6, 2018

(65) Prior Publication Data
US 2020/0183013 A1 Jun. 11, 2020

(30) Foreign Application Priority Data
May 31, 2017 (JP) .............................. JP2017-108755

(51) Int. Cl.
*G01S 17/89* (2020.01)
*G01S 17/42* (2006.01)
(Continued)

(52) U.S. Cl.
CPC .............. *G01S 17/42* (2013.01); *G01S 7/486* (2013.01); *G01S 17/10* (2013.01); *G01S 17/894* (2020.01); *H01L 31/107* (2013.01)

(58) Field of Classification Search
CPC .......... G01S 17/88; G01S 17/89; G01S 17/93; G01S 7/48; G01S 17/02; G01S 17/04;
(Continued)

(56) References Cited

U.S. PATENT DOCUMENTS 5,696,577 A 12/1997 Stettner et al.
5,892,575 A 4/1999 Marino
(Continued)

FOREIGN PATENT DOCUMENTS

JP 2015-078953 A 4/2015

OTHER PUBLICATIONS

Niclass et al., "A 0.18-μm CMOS SoC for a 100-m-Range 10-Frame/s 200 96-Pixel Time-of-Flight Depth Sensor", IEEE Journal of Solid-State Circuits, vol. 49, No. 1, Jan. 2014, pp. 315-330.

*Primary Examiner* — Que Tan Le
(74) *Attorney, Agent, or Firm* — ScienBiziP, P.C.

(57) ABSTRACT

A three-dimensional image element and an optical radar device that have low cost and are capable of detecting a distance to a measurement object at a close distance before a final result of counting the number of pulses is acquired are realized. A pixel storage element has a plurality of binary counters that integrate the number of electrical pulses at mutually different timings and the reading of data by a signal processing circuit and the integration are able to be performed in parallel.

20 Claims, 15 Drawing Sheets

(51) Int. Cl.
    *G01S 17/894*     (2020.01)
    *G01S 7/486*     (2020.01)
    *G01S 17/10*     (2020.01)
    *H01L 31/107*     (2006.01)

(58) Field of Classification Search
    CPC .......... G01S 17/06; G01S 17/08; G01S 17/10; H01L 31/107; H01L 31/09; H04N 5/372
    USPC .................................. 250/208.1, 214 R, 216
    See application file for complete search history.

(56) References Cited

U.S. PATENT DOCUMENTS

| | | |
|---|---|---|
| 8,130,367 B2 | 3/2012 | Stettner et al. |
| 11,336,074 B2 * | 5/2022 | Hong ...................... G01S 17/10 |

\* cited by examiner

152: OPTICAL BAND-PASS FILTER
153: THREE-DIMENSIONAL IMAGE ELEMENT
170: PACKAGE
171: LID GLASS
172: ATMOSPHERE

122: LIGHT EMITTING ELEMENT
123: FAN-LIKE LIGHT RADIATION SYSTEM
124: FAN-LIKE PULSE LIGHT
131: ONE-DIMENSIONAL SCANNING DEVICE
134: FAN-LIKE LASER LIGHT SOURCE
$\theta h$: HORIZONTAL RADIATION ANGLE
$\theta v$: VERTICAL RADIATION ANGLE
$\Delta \theta$: BEAM THICKNESS ately important for peripheral recognition in automobiles, robots, and the like in recent years. As a two-dimensional image sensor, a CCD (charge coupled device) and a CMOS (complementary metal oxide semiconductor) imager are spreading and both of them perform imaging by converting light intensity into an electric signal by a silicon photodiode. As measurement of distance information with high accuracy, a method of radiating laser light and measuring a flight time (Time-of-flight) required for the laser light to be reflected by the object and return therefrom is becoming spread.

THREE-DIMENSIONAL IMAGE ELEMENT AND OPTICAL RADAR DEVICE COMPRISING AN OPTICAL CONVERSION UNIT TO CONVERT SCANNED PULSE LIGHT INTO FAN-LIKE PULSE LIGHT

TECHNICAL FIELD

The present invention relates to a three-dimensional image element and an optical radar device. The invention particularly relates to a three-dimensional image element by which a three-dimensional image mainly constituted by a two-dimensional image of an object and information of a distance to the object is acquired, and an optical radar device utilizing the same.

BACKGROUND ART

A three-dimensional image has a concept that includes not only a normal two-dimensional image such as a photograph but also information of a distance to an object within a field of view, and a three-dimensional image sensor has been extremely important for peripheral recognition in automobiles, robots, and the like in recent years. As a two-dimensional image sensor, a CCD (charge coupled device) and a CMOS (complementary metal oxide semiconductor) imager are spreading and both of them perform imaging by converting light intensity into an electric signal by a silicon photodiode. As measurement of distance information with high accuracy, a method of radiating laser light and measuring a flight time (Time-of-flight) required for the laser light to be reflected by the object and return therefrom is becoming spread.

A method of radiating laser light to a whole of a field of view includes a scanning type in which a laser beam that is narrowed into a dot shape (refer to NPL 1) or a band shape (refer to PTL 1) is used for scanning with a mirror or the like and a single-radiation type in which a laser beam is spread and radiated almost uniformly over a whole of a field of view, and many scanning types in which high beam intensity is easily obtained at an object have been developed. The scanning type is expensive and increased in size because it requires a mechanical configuration for oscillating the beam. On the other hand, the single-radiation type is easily reduced in size because it does not require a mechanical configuration for scanning, but laser light intensity at the object is smaller as compared to that of the scanning type, so that when a distance to the object is long, signal intensity becomes small and accuracy of distance measurement is lowered.

As to measurement of the flight time, since accuracy of time measurement directly leads to distance accuracy, a method of emitting pulse laser light multiple times, repeatedly measuring a time from light emission to light reception, constructing a histogram (horizontal axis: time, vertical axis: frequency), and deciding the flight time is used. This is a method called TCSPC (time-correlated single-photon counting). As a light receiving element, a SPAD (single-photon avalanche diode) is used. Such a method requires a large circuit scale in each pixel and is thus not used in an imager, in which pixels are two-dimensionally arrayed on a large scale, and is mainly used in combination with the scanning type (refer to PTL 2 and NPL 1).

On the other hand, in the single-radiation type, a current of a photodiode is measured and compared to a determination value to decide the flight time. There is also a case where the current is accumulated sequentially in capacitors arranged in time sequence and determination is performed in accordance with an accumulated amount thereof. According to such a mechanism, a three-dimensional image is formed by single laser radiation, so that simultaneity is secured over a whole of a field of view as an image is captured upon irradiation of flash light, speaking in a photograph. Greatly different from the scanning type in which a time varies at each of points of the field of view, the "flash light" is referred (refer to PTL 3 and PTL 4).

CITATION LIST

Patent Literature

PTL 1: Japanese Unexamined Patent Application Publication No. 2015-73953 (published on Apr. 23, 2015)
PTL 2: U.S. Pat. No. 5,892,575 (Apr. 6, 1999)
PTL 3: U.S. Pat. No. 5,696,577 (Dec. 9, 1997)
PTL 4: U.S. Pat. No. 8,130,367 (Mar. 6, 2012)

Non Patent Literature

NPL 1: IEEE JOURNAL OF SOLID-STATE CIRCUITS, VOL. 49, NO. 1, JANUARY 2014, P315-330 "A 0.18-m CMOS SoC for a 100-m-Range 10 Frame/s 200 96-Pixel Time of Flight Depth Sensor." Cristiano Niclass, Member, IEEE, Mineki Soga, Hiroyuki Matsubara, Masaru Ogawa, and Manabu Kaaami, Member, IEEE

SUMMARY OF INVENTION

Technical Problem

However, a conventional technique described above has the following problems.

Since the single-radiation type enables observation of a whole of a field of view at the same time, there is a great advantage that an object close to an optical radar device is able to be detected early. However, pulse light is radiated at once, so that intensity of light radiation at a surface of the object is inevitably reduced. In particular, in automotive application, since the optical radar device needs to operate even under midday intense sunlight directly on the equator, a distance to a measurement object is inevitably short as compared to that of the scanning type. Moreover, according to PTL 3, infrared light with a wavelength of about 1.5 m is used to minimize an effect of background light during daytime, so that silicon is not usable as a light receiving element and a compound semiconductor of InGaAs or the like is used. On the other hand, since signal processing is performed by silicon LSI, an InGaAs photodiode and the silicon LSI need to be layered, resulting in a device which is expensive not only in material but also in process.

On the other hand, in a two-dimensional scanning type in which scanning is performed with pulse light in a dot shape, it is difficult to detect all objects that may be subjected to collision until a whole of a field of view is scanned. In addition, in one-dimensional scanning in which scanning in a horizontal direction is performed with pulse light that has a band shape extending in a vertical direction, an object on a side (for example, a right end of the field of view) where scanning starts is able to be quickly detected, but an object on an opposite side (for example, a left end of the field of view) is difficult to be detected until the scanning ends.

Thus, a three-dimensional image element in which functions from light reception to signal processing are mounted in the same silicon chip and which is inexpensive and has a wide measurement range so that a nearby object is able to be quickly detected to issue a warning, and an optical radar device of a single-radiation type using the same are required.

An aspect of the invention aims to achieve a three-dimensional image element and an optical radar device that have low cost and are capable of detecting a distance to a measurement object at a short distance before a final result of counting the number of pulses is acquired.

Solution to Problem

In order to solve the aforementioned problems, a three-dimensional image element according to an aspect of the invention includes: a light receiving unit in which pixels each including an avalanche photodiode that detects light in a Geiger mode are arranged in a two-dimensional matrix pattern; a pixel storage element to which an electrical pulse is supplied from each of pixels that constitute a column of the pixels; and a signal processing circuit that reads data accumulated by the pixel storage element and acquires, for each of the pixels, at least distance information indicating a distance to an object, in which the pixel storage element has a plurality of binary counters that integrate the number of electrical pulses at mutually different timings, and the reading of the data by the signal processing circuit is able to be performed in parallel with the integration.

In order to solve the aforementioned problems, an optical radar device according to an aspect of the invention includes: a pulse light illumination system that has a light emitting element that emits pulse light, an optical scanning unit that performs scanning with the pulse light in a direction parallel to a first, plane, and an optical conversion unit that converts the pulse light into fan-like pulse light that is spread in a direction vertical to the first plane; and an imaging optical system that images and projects light, which is from at least a part of a region where light is radiated from the pulse light illumination system, onto a light receiving unit of a sensor, which measures at least a distance to an object, through an optical band-pass filter.

Advantageous Effects of Invention

According to an aspect, of the invention, it is possible to achieve a three dimensional image element and an optical radar device that have low cost and are capable of detecting a distance to a measurement object at a short distance before a final result of counting the number of pulses is acquired.

DESCRIPTION OF EMBODIMENTS

Figure 1:
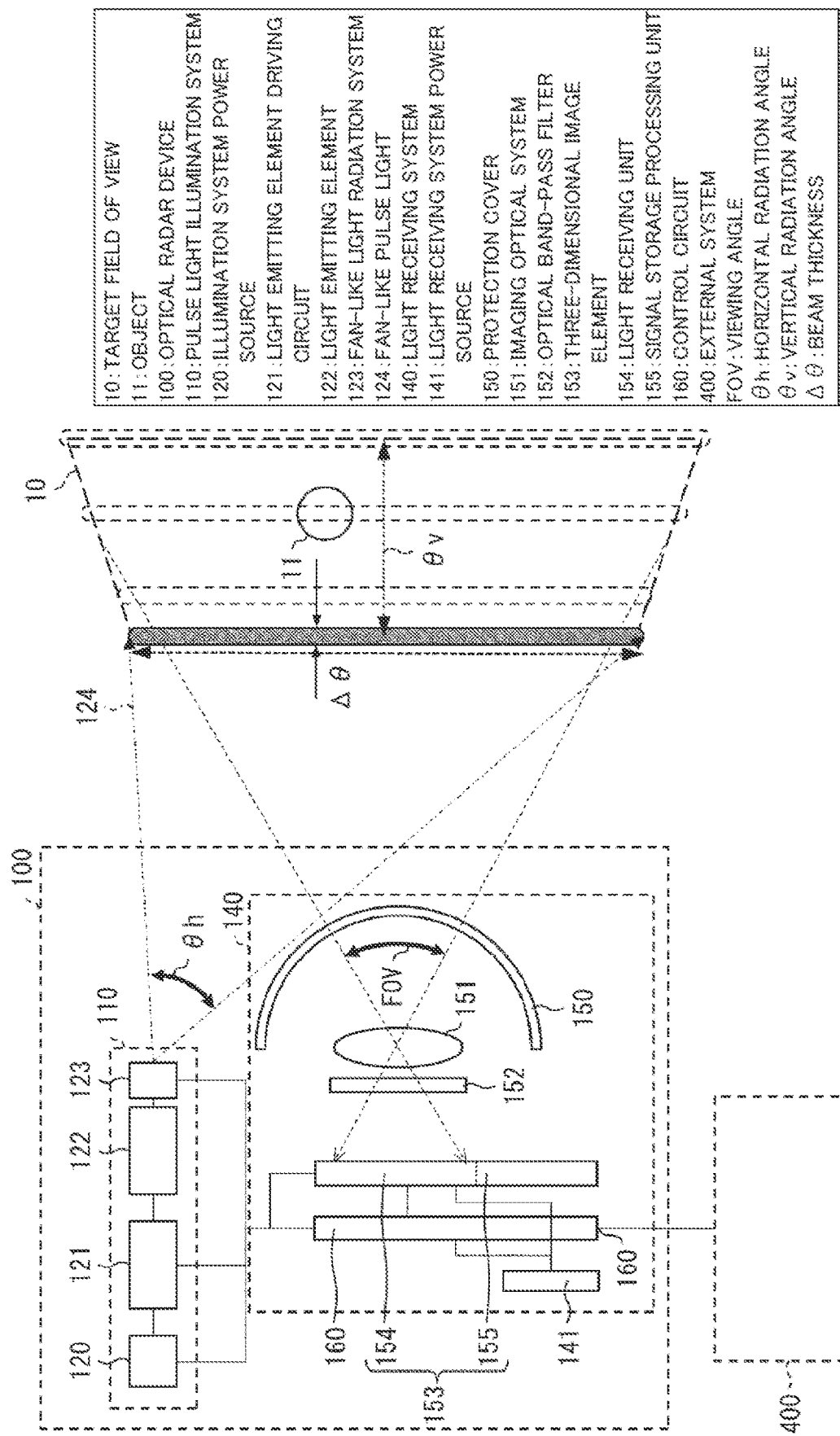
FIG. 1 is a schematic view illustrating a configuration of an optical radar device according to Embodiment 1 of the invention.

Embodiments of the invention will be described with reference to FIGS. 1 to 16. Hereinafter, for convenience of description, a component having the same function as that of a component described in a specific embodiment will be given the same reference sign and description thereof will be omitted in some cases. In the following explanation, a case where fan-like pulse light that is spread in a horizontal direction is radiated to an object on the premise of a field of view that is wider in the horizontal direction than in a vertical direction by assuming application to a land vehicle, distance measurement or the like is performed, and the fan-like pulse light is used for scanning in the vertical direction will be described. However, a point according to an aspect of the invention is that the field of view in a rectangular shape is subjected to measurement in a longitudinal direction in a line at a time, and it is needless to say that application to use (such as a case of mounting in an air vehicle to perform monitoring in the vertical direction) in which the field of view in the vertical direction is wider than the field of view in the horizontal direction is also possible by performing measurement in a line in the vertical direction with use of fan-like pulse light that is spread in the vertical direction.

Embodiment 1

An optical radar device 100 according to Embodiment 1 of the invention will be described with reference to FIGS. 1 to 11. The optical radar device 100 includes a pulse light illumination system 110 that has a light emitting element 122 that emits pulse light, a one-dimensional scanning device (optical scanning unit) 131 that performs scanning with the pulse light in a direction parallel to a first plane, and a fan-like beam generator (optical conversion unit) 132 that converts the pulse light used for scanning by the one-dimensional scanning device 131 into fan-like pulse light 124 that is spread in a direction vertical to the first plane, and an imaging optical system 151 that images and projects light, which is from at least a part of a target field of view (region where light is radiated from the pulse light illumination system) 10, onto a light receiving unit 154 of a three-dimensional image element (sensor) 153, which measures at least a distance to an object 11, through an optical band-pass filter 152. The three-dimensional image element 153 includes the light receiving unit 154 in which pixels Px(i,j) including an avalanche photodiode that detects light in a Geiger mode are arranged in a two-dimensional matrix, at least one pixel storage element Mx(j) that is provided in one-to-one correspondence with a column of the pixels Px(i,j) and supplied with an electrical pulse from a corresponding pixel Px(i,j), and a signal processing circuit DS that reads data accumulated by the pixel storage element Mx(j) and acquires, for each of the pixels Px(i,j), at least distance information indicating the distance to the object 11. The pixel storage element Mx(j) has a plurality of binary counters BC1 to BCγ that integrate the number of electrical pulses described above at different timings, and the reading of the data by the signal processing circuit DS is able to be performed in parallel with the integration.

As illustrated in FIG. 1, the optical radar device 100 includes the pulse light illumination system 110 that radiates the fan-like pulse light 124 to the target field of view 10, and a light receiving system 140 that receives light from at least a part of the target field of view 10. The pulse light illumination system 110 has at least an illumination system power source 120, a light emitting element driving circuit 121, the light emitting element 122, and a fan-like light radiation system 123. The illumination system power source 120 supplies electric power to the light emitting element driving circuit 121. The light emitting element driving circuit 121 pulse-drives the light emitting element 122. The light emitting element 122 emits pulse light. The fan-like light radiation system 123 performs one-dimensional scanning in the vertical direction by using the fan-like pulse light 124 that is spread in the horizontal direction and thereby illuminates a whole of the target field of view 10.

The light receiving system 140 has at least a light receiving system power source 141, the imaging optical system 151, the optical band-pass filter 152, the three-dimensional image element 153, and a control circuit 160. The three-dimensional image element 153 has the light receiving unit 154 and a signal storage processing unit 155. The light receiving system power source 141 supplies electric power to the light receiving system 140. The imaging optical system 151 images and projects light, which is from at least a part of the target field of view 10, onto the light receiving unit 154 through the optical band-pass filter 152. The control circuit 160 controls the three-dimensional image element 153 and the pulse light illumination system 110 and communicates with an external system 400.

(Pulse Light Illumination System 110)

The fan-like pulse light 124 is spread in a fan shape in the horizontal direction and a spread angle thereof is set as a horizontal radiation angle (spread angle in a fan plane of the fan-like pulse light) θh. On the other hand, the spread angle in the vertical direction is small and a beam thickness is set as Δθ (full width at half maximum). The horizontal radiation angle θh>>the beam thickness Δθ is provided. When the fan-like pulse light 124 is used for scanning within a vertical radiation angle (scanning angle) θv in the vertical direction, the target field of view 10 with the horizontal radiation angle θh that is the spread angle in the horizontal direction and the vertical radiation angle θv that is the spread angle in the vertical direction is able to be sequentially subjected to light radiation. Note that, the horizontal radiation angle θh>the vertical radiation angle θv>the beam thickness Δθ is provided. That is, the horizontal radiation angle θh is larger than the vertical radiation angle θv and the vertical radiation angle θv is larger than the beam thickness Δθ. Hereinafter, when rays of fan-like pulse light 124 to be radiated at different angles in the vertical direction need to be distinguished from each other, they are described as fan-like pulse light 124-1 to fan-like pulse light 124-Ns. Ns indicates a total number of times of scanning in the vertical direction.

The fan-like pulse light 124 is preferably uniform in the target field of view 10. However, since detection sensitivity in a place where light intensity is high is high, in a case where there is a place that needs to be particularly gazed in the target field of view 10, the fan-like pulse light 124 is also able to have light intensity distribution in which intensity near the place is increased.

Figure 2:
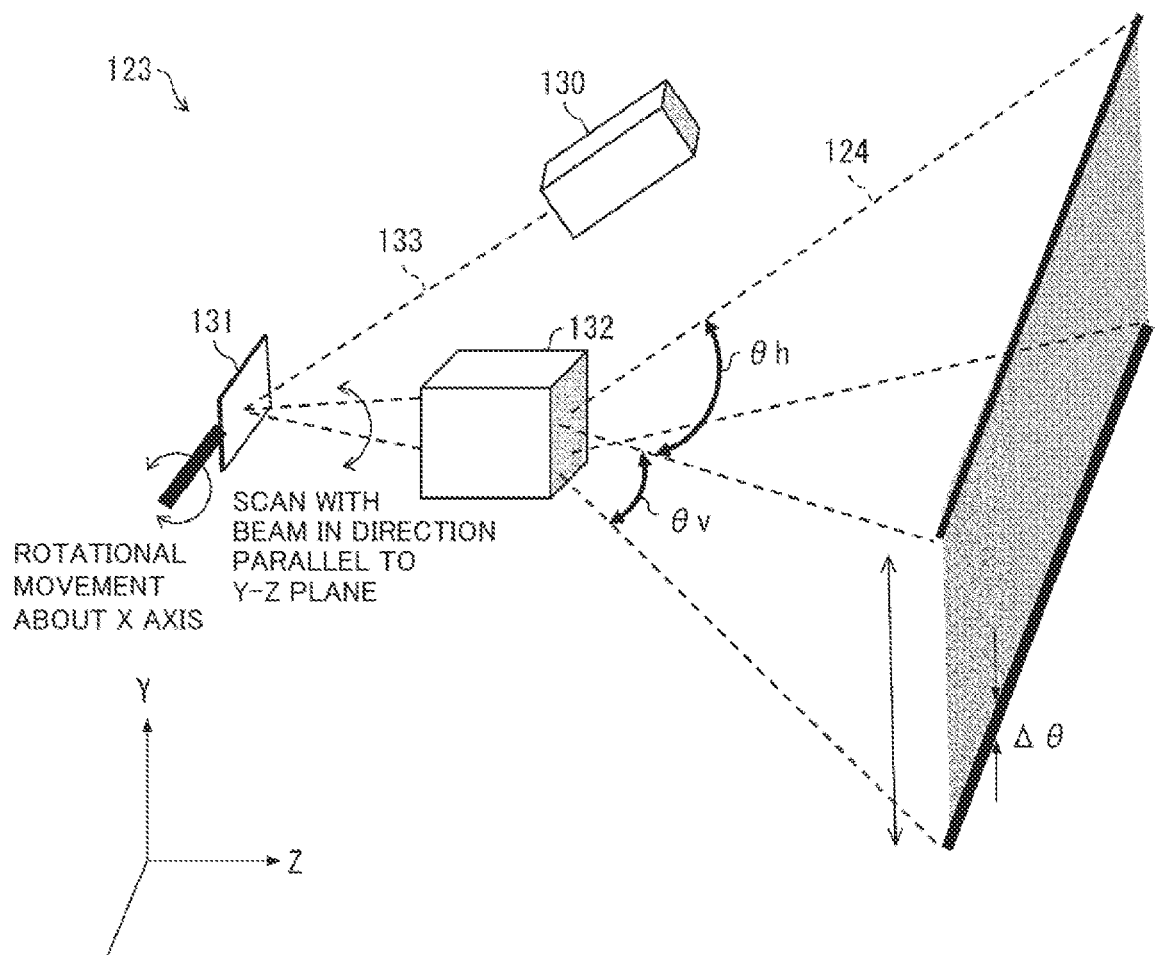
FIG. 2 is a schematic view illustrating a configuration of a fan-like light radiation system that constitutes the optical radar device according to Embodiment 1 of the invention.

FIG. 2 is a schematic view illustrating a configuration of the fan-like light radiation system 123 that constitutes the optical radar device 100. Note that, in FIG. 2, an X direction, a Y direction, and a Z direction that are three directions vertical to each other are defined. Any direction in an X-Z plane corresponds to a horizontal direction and the Y direction corresponds to the vertical direction.

As illustrated in FIG. 2, the fan-like light radiation system 123 has at least a collimate light generator 130 that shapes light from the light emitting element 122 into almost parallel spot light 133 (in a Y-Z plane: first plane), a one-dimensional scanning device 131 that performs scanning with the spot light 133 in the vertical direction (Y direction), and a fan-like beam generator 132 that makes the spot light, a traveling angle of which in the vertical direction is changed by the one-dimensional scanning device 131, spread into a fan shape. When the light from the light emitting element 122 is laser light, the collimate light generator 130 includes a collimator lens. The one-dimensional scanning device 131 is constituted by, for example, a MEMS (microelectromechanical systems) mirror element having a reflection plane that rotationally moves about one axis (which is set as an X axis) in a horizontal plane (X-Z plane). The fan-like beam generator 132 includes, for example, a Powell lens. For example, the spot light 133 whose diverging angle is about 1.5 degrees and whose diameter at an entry of the Powell lens with an aperture of 8.9 mm is about 3 mm is formed by the collimate light generator 130 and laser light is used for scanning at ±10 degrees with respect to the horizontal plane by the one-dimensional scanning device 131 constituted by the MEMS mirror element. Since the Powell lens radiates the laser light at the horizontal radiation angle θh=90 degrees and the beam thickness Δθ=1 degree, the fan-like pulse light 124 is able to be radiated in a range with the horizontal radiation angle θh=90 degrees and the vertical radiation angle θv=20 degrees. The MEMS mirror element is, for example, an electromagnetic type, and changes an angle of a mirror by controlling an amount of a flowing current by the control circuit 160. In an electrostatic or piezoelectric type, the angle of the mirror is able to be changed by controlling a voltage applied from the control circuit 160. The control circuit 160 performs synchronous control of the angle of the mirror and the light receiving system 140 so that a signal from the object 11 irradiated with the fan-like pulse light 124 is able to be detected. The one-dimensional scanning device 131 may be constituted by a polygon mirror, an optical phased array antenna device, or the like other than the MEMS mirror element.

The light emitting element 122 is a light source capable of emitting pulse light like a laser or an LED (light emitting diode), and preferably emitting an infrared ray with a wavelength of about 700 nm to 1000 nm. Further, the light emitting element 122 preferably has a narrow light emission wavelength band and a light emission peak wavelength whose temperature fluctuation is reduced, and an infrared laser is preferable. In particular, the light emitting element 122 is preferably a VCSEL (vertical cavity surface emitting laser) that has a narrow light emission wavelength band and a light emission peak wavelength whose temperature fluctuation is reduced. Though not described in FIG. 1, a temperature control circuit that performs temperature control of the light emitting element 122 may be added to the optical radar device 100 in order to suppress the temperature fluctuation of the light emission peak wavelength.

The light emitting element driving circuit 121 causes a predetermined current to flow in the light emitting element 122 at a predetermined timing to perform pulse light emission from the light emitting element 122. The timing of the light emission by the light emitting element 122 is decided by a signal from the control circuit 160. An amount of the current flowing in the light emitting element 122 may be variable and may be controlled by the control circuit 160. The same is also applied to a time change of a current by which a light emission time of the pulse light is decided. Here, a full width at half maximum (time) of the pulse light is about 1 nsec to several hundreds nsec. Since pulse light with large power of several tens W to several hundreds W is required for the present use, the light emitting element driving circuit 121 generally accumulates electric charges in a capacitor and causes the electric charges to flow in the light emitting element 122 at once to thereby form short pulse light. Thus, the capacitor and/or a switching element may be combined with the light emitting element 122 to form a module.

The illumination system power source 120 has, in addition to a normal low voltage DC (direct current) power source for a logical circuit, a high voltage DC power source of several tens V to charge the capacitor. By controlling an output voltage of the high voltage DC power source and/or a charging time of the capacitor, the power of the pulse light emission is able to be controlled. Further, by controlling a switching speed of the switching element, a pulse width is able to be controlled. Such controls are able to be performed through the control circuit 160.

In a case that the optical radar device 100 acquires data of 30 frames every second, pixel resolution of each of the frames is 0.5 degrees, and the vertical radiation angle θv is 20 degrees, 40 rays of fan-like pulse light 124-1 to fan-like pulse light 124-40 whose travelling angles in the vertical direction are different are radiated in one frame, for example. A time allocated to radiation of fan-like pulse light 124-K is $\frac{1}{1200}$ second, and in this time, an angle of a reflection plane of the one-dimensional scanning device 131 is changed to a setting value and pulse light is emitted from the light emitting element 122. In a case where a pulse light emission frequency is 190 kHz, each fan-like pulse light 124-K radiates 158 (=190,000/30/40) pulses to the object 11.

In a case where setting accuracy of the angle of the reflection plane of the one-dimensional scanning device 131 is not high, the beam thickness Δθ is preferably almost equal to or larger than vertical angle resolution corresponding to one pixel of the light receiving system 140. On the other hand, in a case where the setting accuracy of the angle of the reflection plane of the one-dimensional dimensional scanning device 131 is high, the beam thickness Δθ is preferably almost equal to or smaller than the vertical angle resolution of the pixel. For example, in a case where the setting accuracy of the angle of the reflection plane ±0.2 degrees with respect to the pixel resolution of 0.5 degrees, it is necessary that the beam thickness Δθ≥0.9 (=0.5+0.2×2) degrees to reliably radiate the pulse light to a target pixel. When the beam thickness Δθ=1 degree, only almost 50 (=0.5/1.0) % of the pulse light may be radiated onto a surface of the object 11 that is projected on the target pixel. In a case where the setting accuracy of the angle of the reflection plane is ±0.02 degrees, when the beam thickness Δθ=0.5 degrees (pixel resolution), 90 (=(0.5−0.02)/0.5) % or more of the fan-like pulse light 124 is able to be radiated onto the surface of the object 11 that is projected on the target pixel. Though the discussion above is made by assuming that the surface of the object 11 corresponding to the target pixel is almost uniformly irradiated with light, if nonuniformity of light irradiation is acceptable and increasing irradiation light amount as much as possible is high priority, the beam thickness Δθ is preferably reduced as small as possible. For example, in a case where the setting accuracy of the angle of the reflection plane is ±0.2 degrees, when the beam thickness Δθ=0.5 degrees, a minimum radiation amount is 60 (=(0.5−0.2)/0.5) % of the pulse light and is able to be made larger than a case of uniform radiation with the beam thickness Δθ=1 degree. In a case of the beam thickness Δθ=0.05 degrees, even when angle setting is shifted from a center of the pixel, a beam is not spreading to outside of the pixel, so that almost 100% of the pulse light is able to be radiated. Accordingly, a size of the beam thickness Δθ varies depending on characteristics of the one-dimensional scanning device 131 and a form of radiation to the object surface, but is decided on the basis of the vertical angle resolution corresponding to one pixel, of the light receiving system 140.

An advantage of the optical radar device 100 is that the object 11 is likely to be found by first radiation of a few rays of fan-like pulse light 124 without observing the whole of the target field of view 10. This results from that a longitudinal direction of the target field of view 10 that has a rectangular shape is able to be observed at the same time, but from which part (vertical direction) of the target field of view 10 the observation is to be started and what procedure is to be used to advance scanning vary depending on use. For example, various methods, such as a method of simply moving the fan-like pulse light 124 from a lowermost part to an uppermost part in the vertical direction, a method of moving the fan-like pulse light 124 from the uppermost part to the lowermost part to the contrary, and a method of moving the fan-like pulse light 124 downward from a center part so as to jump over from the lowermost part to the uppermost part and return to the center part, are considered. In a case where the optical radar device 100 is applied to a land vehicle or the like, start from the center part or a vicinity of the lowermost part is preferable. On land, a case where an obstacle floats in air is rare and there are overwhelming number of cases where the object 11 is a person standing on a street or another vehicle. Accordingly, by detecting the object 11 starting from a road surface or a floor surface, the object 11 is able to be detected most reliably and quickly. In a case where the optical radar device 100 is installed at a low position, even start from the center part achieves a similar effect. In such a case, there is a possibility that the object 11 is able to be detected only by the fan-like pulse light 124-1. By advancing scanning by the fan-like pulse light 124-2, the fan-like pulse light 124-3, and . . . , the object 11 is able to be detected more reliably. In a case of performing two-dimensional scanning with a spot-like beam or a case of performing scanning in the horizontal direction by using pulse light that is spread in a band shape in a vertical direction, the object 11 at issue is not able to be detected in some cases until scanning of the whole of the target field of view 10 ends.

On the other hand, in a case of usage for preventing a collision of a drone floating in air, scanning is preferably performed from front in a traveling direction. A scanning procedure is able to be appropriately selected depending on use. In a case where the target field of view 10 having an elongated rectangular shape is observed and scanning is performed in a transverse direction, however, by simultaneously performing observation in a longitudinal direction, a possibility that the object 11 is found promptly increases. In two-dimensional scanning with a spot beam, simultaneous observation in the transverse direction, or scanning in the longitudinal direction, there remains a possibility of failing to find the object 11 unless scanning of the whole of the field of view 10 is completed.

As described above, since order of scanning with use of the fan-like pulse light 124 varies depending on use, it is preferable that the order of scanning is stored by the control circuit 160, and on the basis of the stored information, the fan-like pulse light 124 is used for scanning, and the three-dimensional image element 153 is driven in synchronization with the scanning. Some scanning procedures may be stored so as to be selectable from the external system 400. Moreover, the scanning procedure may be written in storage of the control circuit. 160 from the external system 400. Note that, the storage of the scanning procedure may be performed by an optical radar component other than the control circuit 160, for example, the three-dimensional image element 153. Thereby, it becomes unnecessary to externally control the scanning order for each frame and control of the optical radar device 100 is further facilitated. (Light Receiving System 140)

The imaging optical system 151 is generally a lens. In accordance with a size of the light receiving unit 154 and a viewing angle FOV, a focal distance and an F-number are able to be appropriately selected. The imaging optical system 151 preferably has a high transmittance and a small aberration at a central wavelength of the optical band-pass filter 152 described later. Though FIG. 1 illustrates a lens as the imaging optical system 151, the imaging optical system 151 may be a reflective optical system other than the lens.

The optical band-pass filter 152 has a transmission band in a band of a fixed width with a wavelength peak of the pulse light as a center. A width (full width at half maximum of wavelength distribution of the transmittance) of the transmission band is several nm to several tens nm and is preferably about 10 nm to 20 nm. In general, in a case of operation outdoors, an operation temperature range is widened and a peak wavelength of the pulse light changes with temperature, so that distribution of the pulse light needs to fall within the transmission band at least in the operation temperature range. In a case of the VCSEL, a temperature shift of a peak wavelength is about 0.07 nm/degree, a full width at half maximum of a light emission peak is about 1 nm, and a temperature shift of a central wavelength of the transmission hand of the optical hand-pass filter 152 is 0.025 nm/degree. Thus, even in consideration of a temperature zone from 85° C. to −40° C., a relative wavelength shift between the peak wavelength and the central wavelength of the transmission band is about 5.6 nm and the optical band-pass filter 152 with the transmission band of about 10 nm is usable.

In a case where an interference filter in a flat plate shape that is generally used is used as the optical band-pass filter 152, when an incidence angle at which light from the object 11 is incident on a surface of the filter increases from 0 degrees, the central wavelength of the transmission band shifts to a short wavelength side. Thus, when the viewing angle FOV is wide, the interference filter in the flat plate shape may not be able to secure the same transmission wavelength band in the whole of the target field of view 10. Further, when contacting moisture or oxygen for a long time, the interference filter in the flat plate shape may be denatured and deteriorated with time and is thus preferably blocked from outside air. In FIG. 1, at the front of the imaging optical system 151, a hemisphere dome made of resin transparent to an infrared ray is provided as a protection cover 150. The protection cover 150 protects the light receiving system 140 against outside air. In a case where the protection cover 150 is provided, the optical band-pass filter 152 is also able to be provided, for example, in a surface of the imaging optical system 151 or an inner surface or an inside of the protection cover 150. In a case where the optical band-pass filter 152 is provided in the protection cover 150, by setting a size of a diameter of a hemisphere in accordance with a diameter of the imaging optical system 151, an almost fixed transmission band is able to be secured for light coming from each direction in the target field of view 10. As the diameter of the hemisphere increases, a shift of the transmission band with respect to light that is converged onto each pixel is able to be reduced. However, an outer dimension of the optical radar device 100 increases, so that an actual size is able to be decided by trade-off between both of them. In a practical range, the diameter of the hemisphere is preferably five times or more, more preferably ten times or more of the diameter of the imaging optical system 151. In a case where the optical bands-pass filter 152 as in FIG. 1 is provided at the front of the imaging optical system 151, it is preferable that at least a space therebetween is sealed and filled in an atmosphere in which moisture and oxygen are reduced, in order to suppress degradation of the filter with time.

Figure 3:
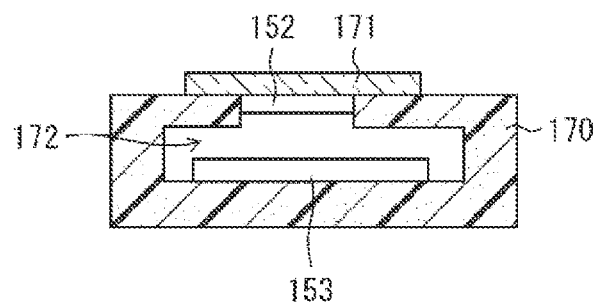
FIG. 3 is a schematic sectional view of a three-dimensional image element package that constitutes the optical radar device according to Embodiment 1 of the invention.

FIG. 3 is a schematic sectional view of a package 170 that is a three-dimensional image element package constituting the optical radar device 100.

In a case where the viewing angle FOV is narrow to such an extent that the shift of the transmission band as described above becomes insignificant so far, the optical band-pass filter 152 is also able to be attached to an inside of lid glass 171 that constitutes an optical window of the package 170 that seals the three-dimensional image element 153. In an atmosphere 172, moisture is preferably removed and oxygen is more preferably removed. Such removal is performed to prevent degradation of the optical band-pass filter 152 over time. Thus, the atmosphere 172 is preferably at least dried air and is more preferably sealed by nitrogen, argon, helium, or the like. Though not illustrated in FIG. 3, silicon resin through which oxygen and moisture are less transmitted is preferably used for bonding the lid glass 171 to the package 170.

The optical band-pass filter 152 may be incorporated inside the imaging optical system 151. The number of optical band-pass filters 152 described in FIGS. 1 and 3 is one, but may be multiple. A first optical band-pass filter may be arranged at the front or the back of the imaging optical system 151 and a second optical band-pass filter may be arranged in an inner surface of the lid glass 171 as described above. When the first optical band-pass filter is provided, energy of light incident on the package 170 is able to be reduced and an effect of suppressing temperature rise is achieved. A transmission band of the first optical band-pass filter is preferably wider than a transmission band of the second optical band-pass filter.

Figure 4:
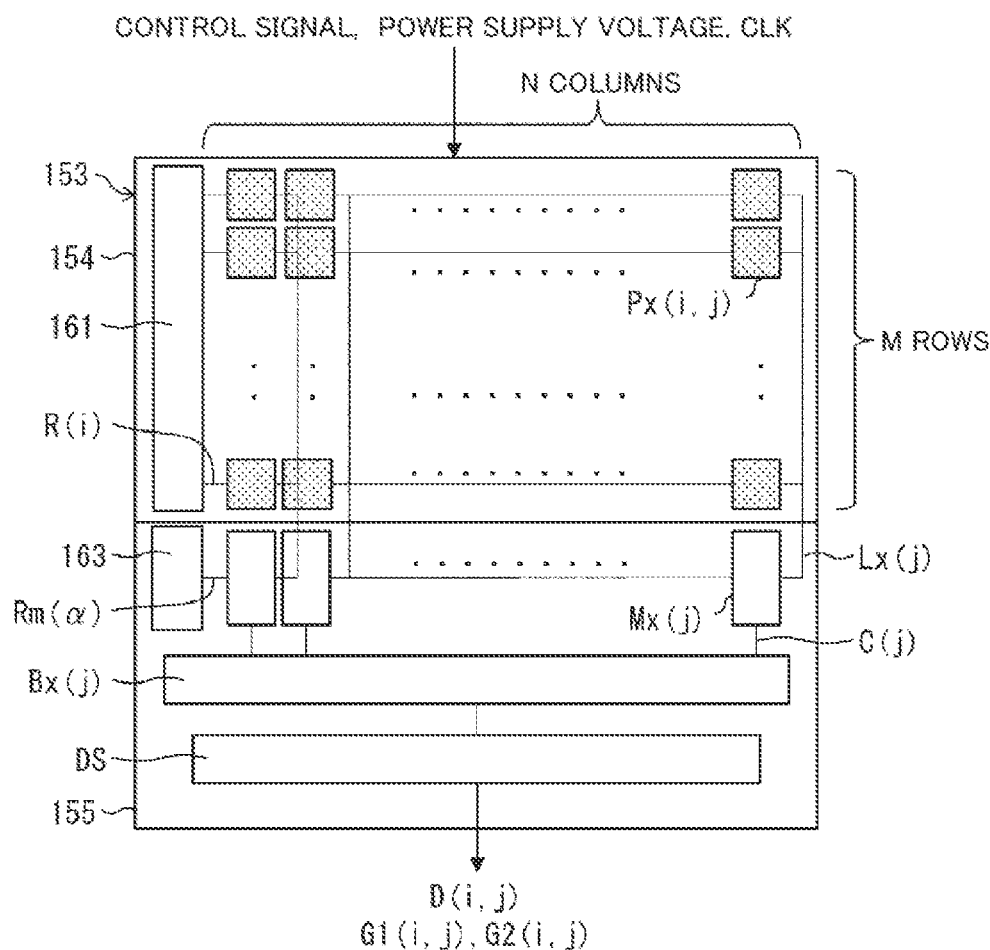
FIG. 4 is a schematic view of a three-dimensional image element that constitutes the optical radar device according to Embodiment 1 of the invention.

FIG. 4 is a schematic view of the three-dimensional image element 153 that constitutes the optical radar device 100.

The light receiving unit 154 and the signal storage processing unit 155 of the three-dimensional image element 153 are able to be formed on a silicon substrate. Though the light receiving unit 154 and the signal storage processing unit 155 are also able to be formed as separate chips, connected by using a vertical via hole, a bump, or the like, and layered, they are preferably configured on the same silicon substrate in a monolithic manner. In a case of a monolithic configuration, since there is no inter-chip connection, lowering of reliability due to connection deterioration, lowering of accuracy caused by a noise increase due to an increase of parasitic capacitance, and further an increase in manufacturing cost are improved. Though the light receiving unit 154 is arranged on an upper side and the signal storage processing unit 155 is arranged on a lower side in FIG. 4 for convenience, the light receiving unit 154 may be arranged in a center part. However, it is not preferable that the light receiving unit 154 and the signal storage processing unit 155 are mixed. This is because a range where the light receiving unit 154 exists extends and the imaging optical system 151 and the lid glass 171 are enlarged, resulting in an increase of cost.

The light receiving unit 154 of the three-dimensional image element 153 has pixels Px(i,j) arranged in m rows and n columns in a two-dimensional matrix, and a light signal from the target field of view 10 is projected by the imaging optical system 151 onto the two-dimensional matrix of the m rows and the n columns. Not all the pixels Px (i,j) are activated at a time. Since the pulse light radiated to the target field of view 10 is the fan-like pulse light 124, only pixels in a row K corresponding to the fan-like pulse light 124-K are activated. For convenience, the fan-like pulse light 124 is numbered from 1 to Ns (=M) from a lowermost part to an uppermost part and i of a corresponding pixel Px(i,j) is numbered from 1 to M from an uppermost part to a lowermost part. Such correspondence is appeared because their orders are reversed to each other via the imaging optical system 151. This is able to be changed depending on a property of the imaging optical system 151. That is, when the fan-like pulse light 124-K is radiated, a pixel Px(K,j) is activated. The activation of the pixel Px(K,j) means that an output signal of at least the pixel Px(K,j) is transmitted to the signal storage processing unit 155. Further, power supply to another pixel Px(i,j) may be stopped so that electric power is supplied only to the pixel Px(K,j).

As a circuit by which the pixel Px(K,j) of the row K corresponding to the fan-like pulse light 124-K is selected, a row selection circuit 161 is provided in the light receiving unit 154. Further, a row selection line R(i) that transmits a signal of the row selection circuit 161 to each of the pixels Px(i,j) is provided. The row selection line R(i) is not limited to a single signal line and may be a plurality of signal lines that are different in polarity and/or voltage. In synchronization with an operation of the one-dimensional scanning device 131 of the fan-like light radiation system 123, the row selection circuit 161 selects the row K to be activated. A signal for synchronization is generated from the control circuit 160. The row selection circuit 161 may control a row selection switch 201 (refer to FIG. 7) of the pixels Px(i,j), for example, so that only an output of each of pixels Px(K,j) (j=1 to N) is supplied to a signal line Lx(j) or may control a switch (not illustrated) so that power supply voltages VSPAD and Vcc are supplied only to each of the pixels Px(K,j) (j=1 to N) (refer to FIG. 7). Both of the controls may be performed.

The signal storage processing unit 155 has at least one pixel storage element Mx(j) corresponding to each column j and the pixel storage element Mx(j) is connected by the respective pixels Px(i,j) and the signal line Lx(j). Each time a photon is received by the pixel Px(K,j), a signal is transmitted to the pixel storage element Mx(j) through the signal line Lx(j) and stored. The signal storage processing unit 155 further has a buffer memory Bx(j), a column signal line C(j), and a signal processing circuit DS. Data accumulated in the pixel storage element Mx(j) is copied to the buffer memory Bx(j) through the column signal line C(j) at a defined timing. The signal processing circuit DS calculates and outputs at least distance information D(K,j) indicating a distance to the object 11, two-dimensional image information G1(K,j), and two-dimensional image information G2(K,j) on the basis of information of the buffer memory Bx(j). The two-dimensional image information $G1(i,j)$ and the two-dimensional image information $G2(i,j)$ are respectively able to be two-dimensional image information by background light and two-dimensional image information by reflection light of the pulse light, but are not limited thereto. The signal storage processing unit 155 may have a memory selection circuit 163 and a memory selection line Rm($\alpha$) that are used to select an a part (binary counter BC$\alpha$ described later) of the pixel storage element Mx(j). In a case where the pixel storage element Mx(j) outputs a signal to the column signal line C(j), when all outputs are output in parallel, a large amount of wires are required. Therefore, by reading the signal for each binary counter BC$\alpha$ constituting the pixel storage element. Mx(j), the number of wires is able to be reduced. In an allowable range of the number of wires, signals of a plurality of binary counters may be output in parallel.

In the signal storage processing unit 155, reading of the signal from the pixel storage element Mx(j) and accumulation of the signal in the pixel storage element Mx(j) are able to be performed in parallel. As a result, a pixel Px(i,j) having high signal intensity is able to be detected early. In general, the pixel Px(i,j) having high signal intensity captures a closer object 11, thus making it possible to detect the close object 11 early and issue an alarm. Moreover, any order of reading of the pixel storage element Mx(1) is able to be selected.

(Light Receiving Unit 154)

Figure 5:
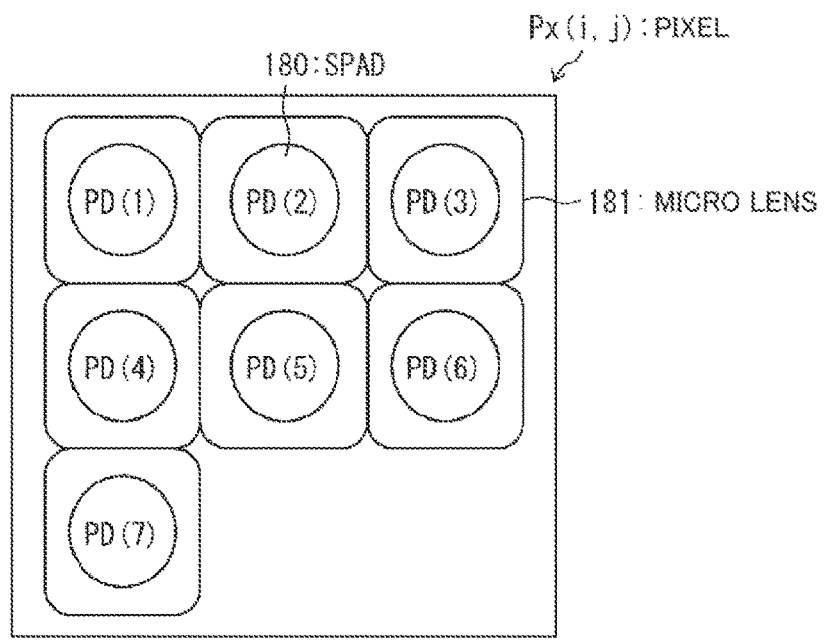
FIG. 5 is a schematic view of a surface of a pixel of the three dimensional image element according to Embodiment 1 of the invention.
Figure 6:
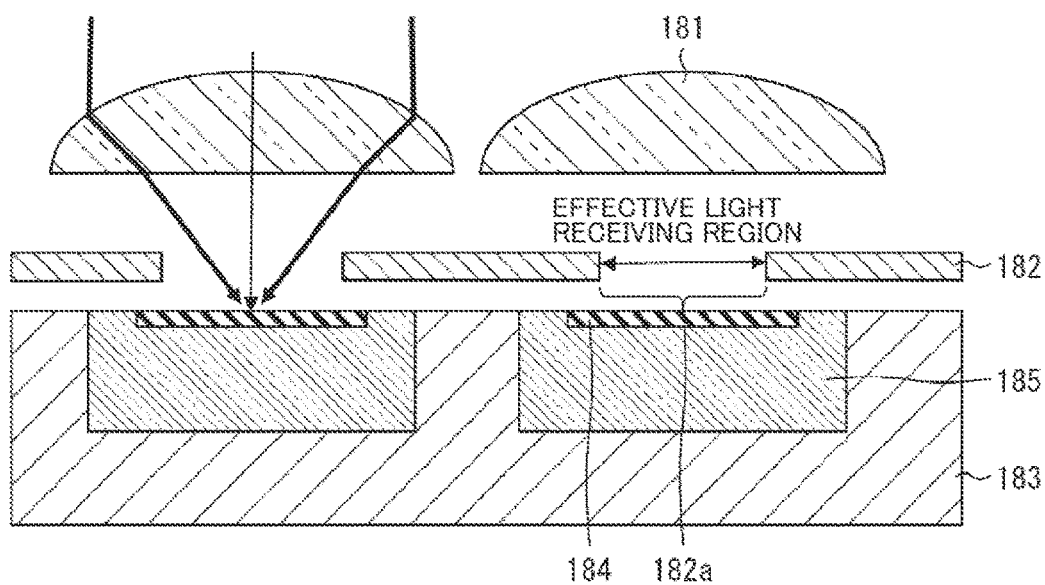
FIG. 6 is a schematic sectional view of the pixel of the three dimensional image element according to Embodiment 1 of the invention.
Figure 7:
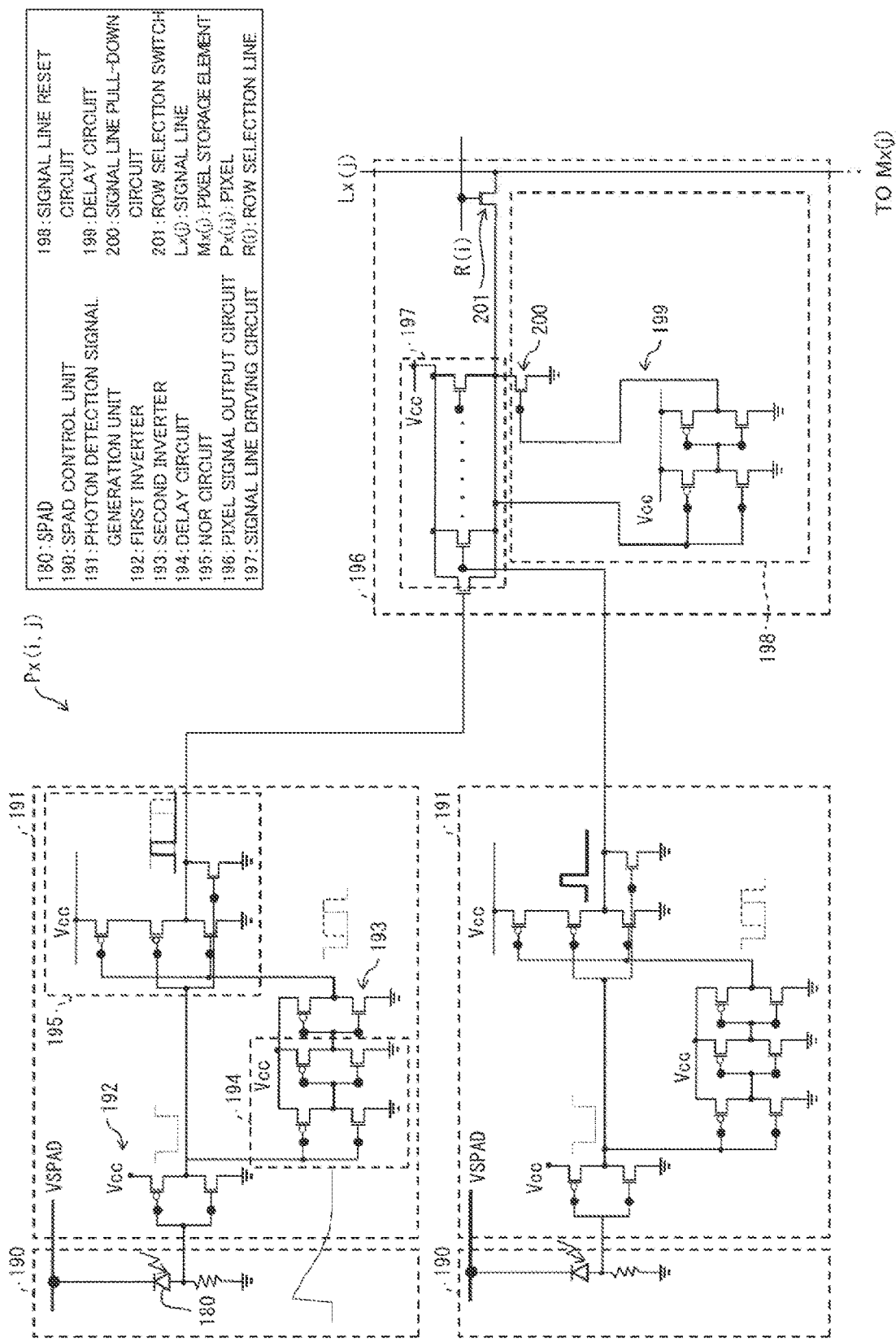
FIG. 7 is a schematic circuit diagram of the pixel of the three-dimensional image element according to Embodiment 1 of the invention.

FIG. 5 is a schematic view of a surface of a pixel Px(i,j) of the three-dimensional image element 153. FIG. 6 is a schematic sectional view of the pixel Px(i,j) of the three-dimensional image element 153. FIG. 7 is a schematic circuit diagram of the pixel Px(i,j) of the three-dimensional image element 153.

The light receiving unit 154 has the pixels Px(i,j) arranged in a two-dimensional matrix of in m rows and n columns. As illustrated in FIG. 5, the pixel Px(i,j) is constituted by one or more SPADs (Single-Photon-Avalanche-diodes) 180. Each of the SPADs 180 has a micro lens 181 as illustrated in FIG.

6. A structure of the SPAD 180 may have various forms, but details thereof will not be given here.

The SPAD 180 has a configuration in which a p$^+$ diffusion layer 184 is formed on a surface of an n-type diffusion layer 185 formed on a silicon substrate 183. A surface of the silicon substrate 183 is covered with a metal shield 182 at a predetermined interval. The metal shield 182 has an opening 182a that is formed so as to expose a part of the p$^+$ diffusion layer 184. The opening 182a forms an effective light receiving region so that light incident through the micro lens 181 passes through the p$^+$ diffusion layer 184.

Here, each of the SPADs 180 is described as a PD(a) (a=1 to Nspad, Nspad: total number of SPADs 180 belonging to one pixel). In FIG. 5, except for lower right of a pixel part in which a circuit such as an output circuit is arranged, the SPADs 180 are arranged at an almost equal distance. This is because light with a range as wide as possible is converged by using the micro lens 181 to increase detection sensitivity. However, as long as the sensitivity is sufficient and a pixel area is able to be reduced from a viewpoint of circuit layout, the respective SPADs 180 may be concentratedly arranged in a fixed range. An optimum value of Nspad changes depending on the number of photons Md received by one pixel during a deadtime Td of a SPAD 180 that is used. The deadtime Td is a time required for one SPAD 180 to detect a photon and to be then ready to detect a next photon, and has a length of the time during which the SPAD 180 does not function as a sensor, literally. The deadtime Td generally has a length of about several nsec to 100 nsec. When the number of photons Md<<1, Nspad may be small or Nspad may be 1. When a case where the number of photons Md exceeds 1 can occur, however, if the number of SPADs 180 is one, a period of a next deadtime Td is not able to be measured at a stage where the first one is counted, so that an upper limit of the countable number of photons is 1 and a correct number of photons that are received is not able to be measured. Thus, when the number of photons Md is close to 1 or when the number of photons Md is larger than 1, Nspad needs to be increased. When a fill factor (a ratio of a total area of an effective light receiving region relative to a pixel area) is the same, detection sensitivity is enhanced as Nspad increases.

An example of a circuit configuration of a pixel Px(i,j) is illustrated in FIG. 7. The pixel Px(i,j) has a SPAD control unit 190 and a photon detection signal generation unit 191 as a part belonging to each of the SPADs 180. The SPAD control unit 190 is a circuit that supplies electric power to the SPAD 180, and when detecting a photon, performs quenching and restores a state to a measurement state after the deadtime Td. Though the SPAD control unit 190 in FIG. 7 is illustrated briefly by a circuit in which one resistor is added in addition to the SPAD 180 by assuming passive quenching, an active quenching circuit may be used. Further, it is also possible to add various circuits such as a circuit that controls activation of the SPAD 180. The photon detection signal generation unit 191 is a circuit that, when the SPAD 180 detects a photon, detects a rise of a terminal voltage of the SPAD 180 and outputs one pulse having a fixed width. FIG. 7 illustrates an example in which the photon detection signal generation unit 191 is constituted by a first inverter 192, a delay circuit 194, a second inverter 193, and a NOR circuit 195. The delay circuit 194 is illustrated by two-stage inverters in FIG. 7, but may be multiple-stage (even number of) inverters or a delay circuit having another configuration. A delay time of the delay circuit 194 decides a pulse width. The delay time is preferably from about 0.1 nsec to about several nsec.

Each of the pixels Px(i,j) has a pixel signal output circuit 196. This is a circuit that receives a photon detection signal from each of the SPADs 180 in parallel and transmits a pulse having almost the same length as that of the photon detection signal to the signal line Lx(j). Note that, the pixel signal output circuit 196 is connected to the signal line Lx(j) through the row selection switch 201. Only the row selection switch 201 of the row K selected by the row selection circuit 161 is turned on by a signal from a row selection line R(K) and row selection switches 201 of the other rows are turned off. Such a state continues while the row K is selected.

In a case where a plurality of SPADs 180 generate photon detection signals at almost the same time, the pixel signal output circuit 196 is not able to distinguish the signals, but is able to reduce an electrical pulse width passing through the signal line Lx(j) as short as possible in order to minimize such a case. The pixel signal output circuit 196 is constituted by a signal line driving circuit 197, a signal line reset circuit 198, and a delay circuit 199 in FIG. 7, but is not limited thereto. The signal line driving circuit 197 is a circuit that supplies a current to the signal line Lx(j) upon reception of the photon detection signals and raises potential thereof, and operates completely in parallel with the respective photon detection signals. In FIG. 7, the signal line driving circuit 197 has a configuration in which NMOS transistors that receive an output from each of photon detection signal generation units 191 by a gate are arrayed in parallel, but may have another configuration. For example, a configuration in which the output from each of the photon detection signal generation units 191 is received by an AND circuit and one NMOS transistor having high driving capability is turned on by an output of the AND circuit may be provided.

The signal line driving circuit 197 needs to have capability of driving the signal line Lx(j) with a short signal delay time and transmit a signal to the pixel storage element Mx(j). The delay time is decided by the driving capability of the NMOS transistor of the signal line driving circuit 197 with respect to parasitic capacitance of the signal line Lx(j). The delay time is preferably on a level almost the same as or less than at least the pulse width generated by the photon detection signal generation unit 191. In order to reduce the electrical pulse width passing through the signal line Lx(j) as short as possible, the signal delay time in the signal line Lx(j) is preferably short and the signal line Lx(j) is preferably short.

The signal line reset circuit 198 is a circuit that returns the potential of the signal line Lx(j), which has been raised by the signal line driving circuit 197, to original potential, and is constituted here by the delay circuit 199 that delays the signal of the signal line Lx(j) and a signal line pull-down circuit 200, but may have another configuration. After the potential of the signal line Lx(j) rises and the pixel storage element Mx(j) reacts, in order to promptly reduce the potential, the signal line pull-down circuit 200 causes the signal line Lx(j) to ground at a ground level and drops the potential after the delay time of the delay circuit 199. The delay circuit 199 is illustrated by two-stage inverter chains, but may be inverter chains with an even number of two or more stages or may be another delay circuit.

Though the photon detection signal is a pulse that rises from a ground level to a Vcc level in FIG. 7, a similar function is able to be achieved even by a pulse that drops from the Vcc level to the ground level. Further, though the pulse width of the signal passing through the signal line Lx(j) is almost decided by the photon detection signal generation unit 191 in the configuration of FIG. 7, a configuration in which the pulse width is decided by the pixel signal output circuit 196 may be provided. The signal line Lx(j) is indicated by one wire in FIG. 7, but may have a plurality of wires. For example, with a circuit configuration in which two wires are paired and a potential difference is generated therebetween by the pixel signal output circuit 196 with the photon detection signal, a signal line may transmit the potential difference between the paired wires. In addition, when Nspad is large, the pixel signal output circuit 196 may be divided into a plurality of circuits each of which is provided with a signal line.

(Pixel Storage Element Mx(j))

Figure 8:
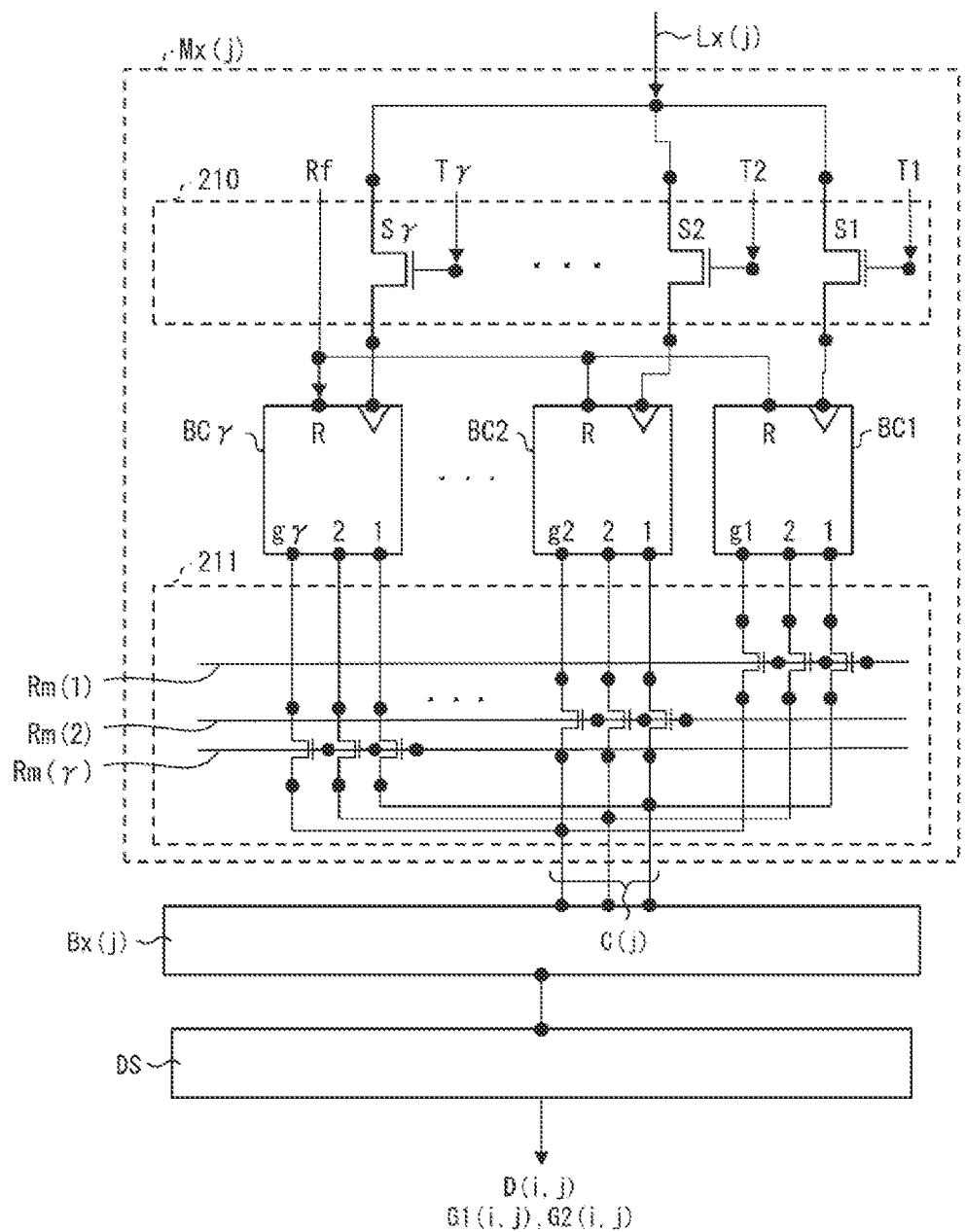
FIG. 8 is a schematic view of a pixel storage element and a signal storage processing unit of the three-dimensional image element, according to Embodiment 1 of the invention.

FIG. 8 is a schematic view of the pixel storage element Mx(1) and the signal storage processing unit 155 of the three-dimensional image element 153. FIG. 9(a) is a timing chart illustrating a driving timing of the pixel storage element Mx(j) of the three-dimensional image element 153. FIG. 9(b) is a waveform diagram illustrating enlarged reflection pulse light.

In an example illustrated in FIG. 8, the pixel storage element Mx(j) has at least the plurality of binary counters BC1 to BCγ, a time switch 210 by which the signal line Lx(j) is selectively connected to the binary counters BC1 to BCγ, and an output switch 211 that, upon selection by the memory selection circuit 163, supplies an output of the binary counter BCα to the column signal line C(j). The time switch 210 is constituted by switches S1 to Sγ that are NMOS transistors in FIG. 8. The output switch 211 is constituted by an NMOS transistor in which the memory selection line Rm(α) is a gate input. The binary counter BCα is connected to the signal line Lx(j) in a time ΔTα during which a switch Sα is turned on, and integrates the number of pulses transmitted from the pixels (i,j). The number of output bits gα of the binary counter BCα is decided by a maximum value of the number of photons that is counted. Also during the integration by the binary counter BCα, an output of the binary counter BCα is able to be read out to the buffer memory Bx(j) through the output switch 211.

Figure 9:
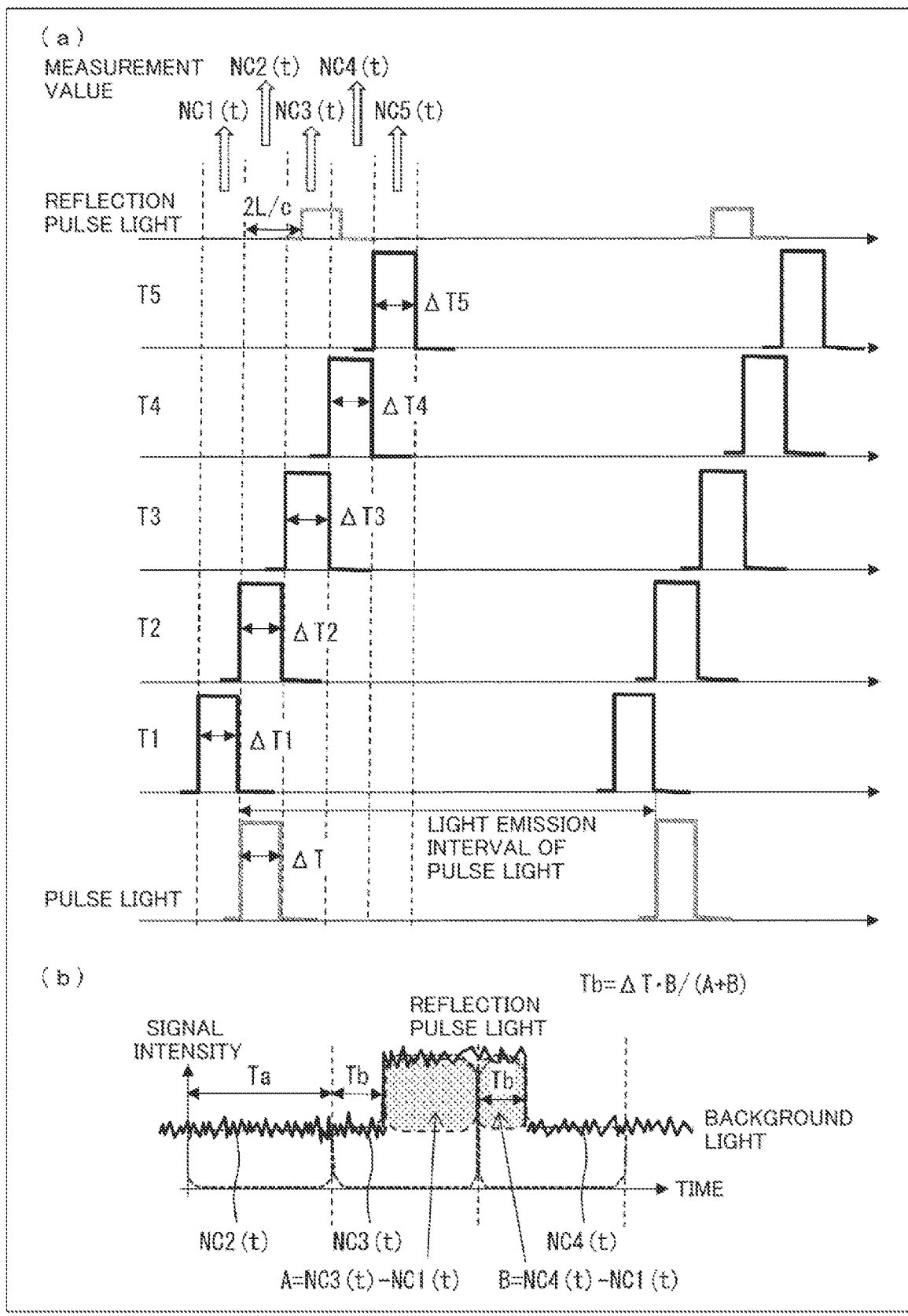
FIG. 9($a$) is a timing chart illustrating a driving timing of the pixel storage element of the three-dimensional image element according to Embodiment 1 of the invention and FIG. 9($b$) is a waveform diagram illustrating enlarged reflection pulse light.

Signals T1 to Tγ that drive the time switch 210 are signals by which the switches S1 to Sγ are sequentially turned on in time sequence as illustrated in FIG. 9. In FIG. 9, the pulse width of pulse light and time widths ΔT1 to ΔTγ (series of time sections continuously arranged in time sequence) in which the switches S1 to Sγ are turned on are equal to a full width at half maximum ΔT of the pulse light, but there is no limitation thereto. Here, the switch S1 is turned on before emission of the pulse light, so that the binary counter BC1 measures intensity of background light. Thus, a time width ΔT1 in which the switch S1 is turned on does not need to be necessarily the same as a time width ΔTα that is an on-time of another switch Sα. For example, when the time width ΔT1 in which the switch S1 is turned on has a length multiple times of the time in which another switch Sα is turned on, a noise level of the binary counter BC1 is able to be reduced. In such a case, an operation of performing division by a multiple by which the length of the on-time is lengthened as compared to that of another switch Sα and performing conversion into data with the same time length as that of another binary counter BCα by the signal processing circuit DS increases only for the binary counter BC1. The time widths ΔT2 to ΔTγ are preferably almost the same as or shorter than the full width at half maximum ΔT of the pulse light, and when being longer to the contrary, an effect of the background light increases and an SN ratio of a signal is reduced. For example, in a case where the time widths ΔT2 to ΔTγ have a length twice of the full width at half maximum ΔT of the pulse light, a background light measurement time becomes twice of a time during which reflection light of the pulse light may be detected. Thus, an intensity ratio of the reflection light of the pulse light to be detected to the background light is ½ as compared to that of a case where the time widths ΔT2 to ΔTγ are almost the same as the full width at half maximum ΔT of the pulse light. Accordingly, detection sensitivity for the object 11 which is remote and whose reflection light of the pulse light is weak with respect to the background light is deteriorated.

Since the switch S2 described later is turned on at the same time with light emission of the pulse light, the binary counter BC2 receives the pulse light that is reflected in an extremely short time. That is, in a case where the object 11 is at a position very close to the three-dimensional image element 153, a count number of the binary counter BC2 is increased compared to that of the binary counter BC1. When a distance between the object 11 and the three-dimensional image element 153 is a distance L, reflection light of the pulse light reaches the three-dimensional image element 153 after 2 L/c (c: light speed). Thus, corresponding one or two binary counters (binary counters BC3 and BC4 in an example of FIG. 9(a)) receive light with signal intensity higher than that of the background light.

The foregoing integration is performed throughout the plurality of rays of fan-like pulse light 124-K that are generated over a period during which the row K is selected (for example, 1/1200 sec). That is, a series of integrated values arranged in time sequence acquired by the three-dimensional image element every multiple times of pulse light radiation is integrated with each other. At a time of end in each row, data accumulated in each of binary counters BCα is read out to the buffer memory Bx(j). Subsequently, a resent signal Rf is activated and the previous count number is cleared, so that measurement for a next row is ready to start.

Here, a total number γ of binary counters BC1 to BCγ has the following relation with a maximum measurement distance Dmax and the full width at half maximum ΔT of the pulse light.

$$D\text{max} < (\gamma - 2) \cdot c \cdot \Delta T / 2$$

Here, a reason why the formula does not use an equal sign will be described in a next example. Considered is a case of Dmax=30 m, ΔT=100 nsec, and γ=4. A reflection pulse from the object 11 at a distance of 30 m is counted by the binary counter BC4. However, even when a value thereof is significantly larger than that of the binary counter BC1, it is not possible to determine that the distance to the object 11 is 30 m as long as a value of the binary counter BC5 is almost equal to that of the binary counter BC1, so that a measurement result indicating that the distance to the object 11 is 30 m is not obtained. On the other hand, when the distance to the object 11 is less than 30 m, a value of the binary counter BC3 is significantly larger than the value of the binary counter BC1 and distance measurement may be enabled from the binary counter BC3 and the binary counter BC4, so that measurement is able to be performed.

By reducing the full width at half maximum ΔT of the pulse light and increasing the total number γ of binary counters BC1 to BCγ, distance measurement accuracy is able to be improved. In particular, by detecting a plurality of peaks, multiple reflection may be detected or a light transmitting object and the object 11 at a position on a deep side thereof may be detected at the same time. On the other hand, when the total number γ of binary counters BC1 to BCγ increases, an area of the pixel storage element Mx(j) increases, which leads to an increase of a chip area and an increase of cost. However, since the pixel storage element Mx(j) and the signal processing circuit DS are basically logic circuits, by adopting a silicon LSI manufacturing process being further miniaturized, an area is able to be reduced. Since manufacturing cost for such a miniaturization process is reduced year by year, the total number γ of binary counters BC1 to BCγ may increase from several tens to several hundreds in the future.

As illustrated in FIG. 9(a), it is necessary that the signals T1 to Tγ are not overlapped with each other in principle, cover a time zone for measurement without leakage, and have equal pulse widths to be activated. However, since the signals T1 to Tγ need to be distributed to all pixel storage elements Mx(j), a slight difference may be caused in a wire delay or the like due to a variation of a delay between wires or the like. Since a difference of the activated pulse widths of the signals T1 to Tγ directly leads to accuracy of a measurement value of the distance, it is necessary to adopt a circuit configuration and/or wire arrangement having high time accuracy in accordance with required accuracy of the optical radar device 100.

The time switch 210 is constituted by the switches S1 to Sγ that are directly turned on/off by the signals T1 to Tγ in the example of FIG. 8, but may be constituted by another circuit. For example, a configuration in which outputs of a simple shift resistor (number of bits; γ) are supplied to the switches S1 to Sγ and an on-state is sequentially shifted by a clock signal may be provided. This makes it possible not only to reduce the number of signals but also to reliably turn on only one of the switches S1 to Sγ, resulting that, between switches Sα and S(α+1) which are turned on in adjacent time zones, generation of a gap or overlap between the time zones in which the switches are turned on is prevented and a counting error is able to be reduced. The time switch 210 may have any configuration as long as being such a circuit in which there is less gap or overlap of the on-time between adjacent switches.

In the foregoing description, a reason why the binary counter BCα is selected as a circuit that counts a pulse signal, which is generated when the light receiving unit 154 detects a photon, in time sequence is that the binary counter BCα is able to be constituted by a relatively simple circuit, and when being constituted as an integrated circuit, is able to achieve a function of count and integration with a small area. The reason is also that the binary counter BCα is a simple logic circuit so that a wide operation margin is easily obtained and design is simple. Though the binary counter has such an advantage, the pixel storage element Mx(j) does not need to be necessarily constituted by the plurality of binary counters BC1 to BCγ. Another configuration is also possible as long as being a circuit that, in combination with the time switch 210, integrates and stores the detected number of photons every series of time sections almost continuously arranged in time sequence. Moreover, it is preferable that a halfway result of integration is able to be read during integration without greatly affecting an integration operation.

(Buffer Memory Bx(j))

It is also possible that the signal processing circuit DS directly accesses the pixel storage element Mx(j) and extracts distance information or the like by a method described later from photon count data being integrated. When the pixel storage element Mx(j) is sequentially subjected to reading for processing, however, a great time difference is caused between a processing timing of a pixel storage element Mx(1) and a processing timing of a pixel storage element Mx(N) and detection sensitivity may vary. A memory in which information of the pixel storage element Mx(j) is copied and held in order to suppress such a time difference to the minimum is the buffer memory Bx(j). When information of the pixel storage element Mx(j) is copied to the buffer memory Bx(j) all at once and the signal processing circuit DS performs signal processing on the basis of data of the buffer memory Bx(j), it is possible to secure simultaneity of data and achieve uniform detection sensitivity between pixels in a row.

(Signal Processing Circuit DS)

A function of the signal processing circuit DS will be described on the basis of the example of FIG. 9(a). When a pulse count number of each of the binary counters BCα for data of the pixel storage element Mx(j), which is copied to the buffer memory Bx(j), at a certain time t is $NC\alpha(t)$ (a group of series of integrated values arranged in time sequence), a count number $NC1(t)$, a count number $NC2(t)$, and a count number $NC5(t)$ indicate almost equal values except for noise and represent intensity of the background light in the example of FIG. 9(a). On the other hand, a count number $NC3(t)$ and a count number $NC4(t)$ include reflection light of the pulse light and are significantly larger than the count number $NC1(t)$, the count number $NC2(t)$, and the count number $NC5(t)$. As a result, the distance to the object 11 is calculated by the following formula.

$$D(t)=c\cdot\Delta T\cdot[1+\{NC4(t)-NC1(t)\}/\{NC3(t)+NC4(t)-2\cdot NC1(t)\}]/2$$

Here, a meaning of the formula will be described with reference to FIG. 9(b). "1" in [ ] is a numeral obtained by dividing a time period Ta, a part of time until the reflection light of the pulse light is incident, by the full width at half maximum $\Delta T$ of the pulse light. That is, the numeral indicates a part corresponding to an integral multiple of the full width at half maximum $\Delta T$ in the time from when radiation of the pulse light starts to when reflection light thereof is incident (accuracy with the same length as the time section), and is "1" in the example illustrated in FIG. 9(b). Here, the numeral is an integer equal to or more than 0, and when the object is at a long distance, the integer increases, and when the object is at a short distance, the integer decreases. A part other than an integer in [ ] corresponds to a time period Tb (accuracy shorter than the time section). That is, a value obtained by dividing the time period Tb by the full width at half maximum $\Delta T$ is equal to a value obtained by dividing $B(=NC4(t)-NC1(t))$ by a sum of $A(=NC3(t)-NC1(t))$ and B in the figure. Thus, a length of the time period Tb is $\Delta T\cdot B/(A+B)$ Here, A is an integrated value of reflection pulse light intensity measured during a timing T3 and B is an integrated value of reflection pulse light intensity measured during a timing T4. Since the pulse width of the pulse light and a time length for measurement are the same, the reflection light is detected in at most only two adjacent sections as illustrated in FIG. 9(b). Accordingly, a length of the time period Tb is calculated similarly from the intensity of the reflection light of the pulse light regardless of the distance to the object. Moreover, a reason why the formula is divided by 2 is that light reciprocates to the object 11 in a time period that is a sum of the time period Ta and the time period Tb, so that the formula needs to be divided by 2 to perform conversion into the distance to the object 11.

The signal processing circuit DS is able to output a distance signal D(t) as a distance information D(i,j) to each of the pixels Px(i,j). As the two-dimensional image information $G1(i,j)$ and $G2(i,j)$, the followings are able to be output.

Background light signal: $G1(i,j)=NC1(t)$

Pulse light reflection light signal: $G2(i,j)=IC(t)=NC3(t)+NC4(t)-2\cdot NC1(t)$ In this manner, in the invention, in the count numbers NCα(t) of a pulse, an integrated value larger than a noise level is obtained and a pair of the larger integrated value and an integral value temporally adjacent thereto is obtained, so that a distance to the object is able to be calculated from the count numbers with accuracy shorter than the time section. With a method of simply deciding a flight time from a time zone indicating a maximum value of NCα(t) like TCSPC, the flight time is able to be decided only with accuracy of c·ΔT/2. (Integer part in [ ] of D(t)) Thus, in a case of a method such as TCSPC, in order to increase accuracy of measurement of the flight time, it is necessary to reduce ΔT and increase the number of NCα(t). This increases a circuit scale, so that an area of the signal storage processing unit 155 increases and cost increases. According to the present method, however, even when ΔT is reduced, the flight time with accuracy of c·ΔT/2 or less is able to be decided by using a plurality of NCα(t) temporally adjacent to each other (part other than an integer in [ ] of D(t)) and accuracy of measurement of the distance to the object is able to be enhanced.

Figure 10:
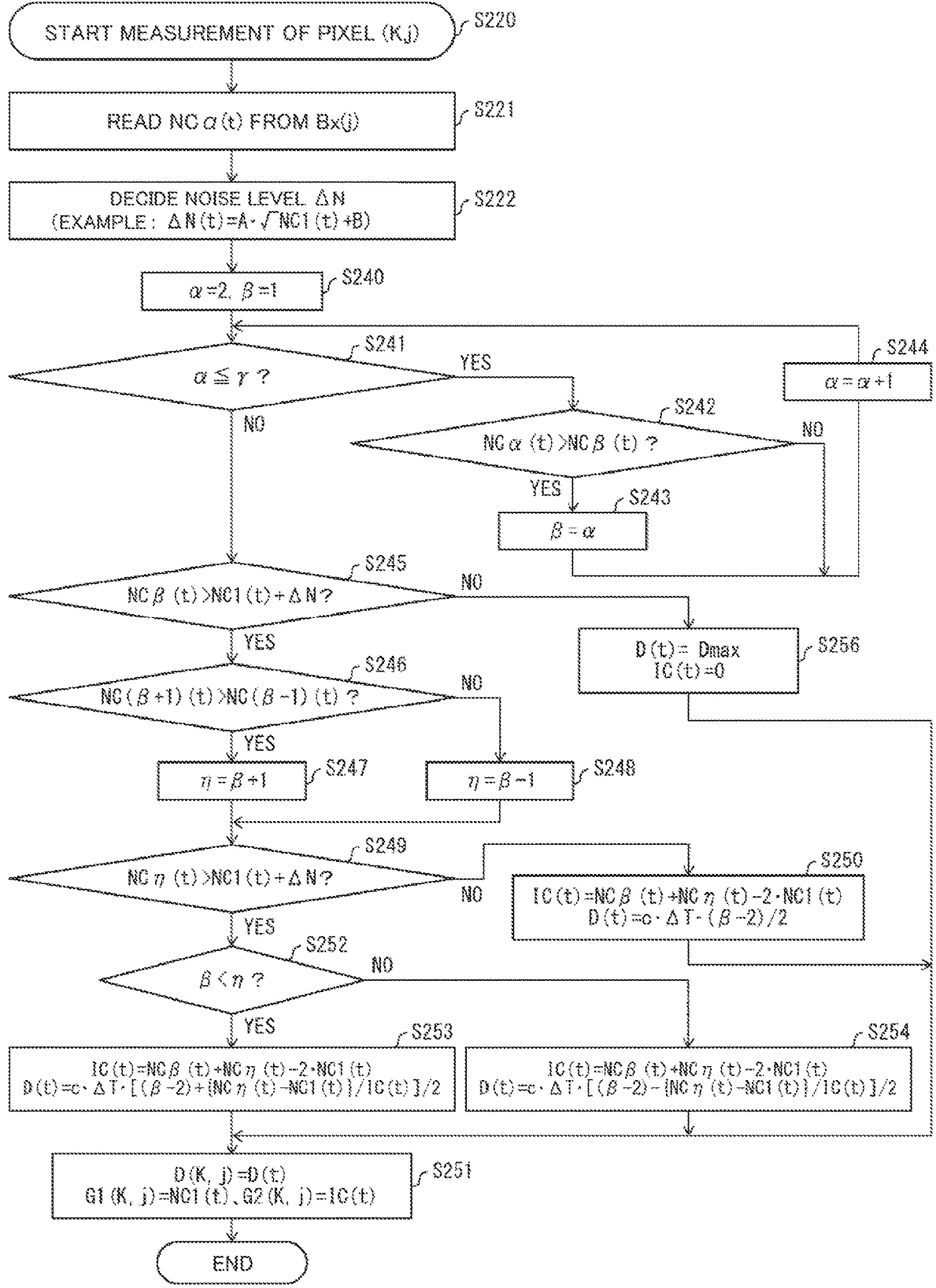
FIG. 10 is a flowchart illustrating a signal processing procedure of a signal processing circuit of the three dimensional image element according to Embodiment 1 of the invention.

Though an output signal is measured basically along an idea as described above, an actual count value includes noise, so that determination needs to be performed more carefully. A procedure thereof is illustrated in FIG. 10. FIG. 10 is a flowchart illustrating a signal processing procedure of the signal processing circuit DS of the three-dimensional image element 153.

Here, measurement of a pixel Px(K,j) will be described (refer to S220). The signal processing circuit DS may process the pixels Px(i,j) serially or process the pixels Px(i,j) in parallel by providing a plurality of calculation circuits. First, count numbers NC1(t) to NCγ(t) are read from the buffer memory Bx(j) and stored in a memory of the signal processing circuit DS (refer to S221). When a count number of the count number NCα(t) is small, noise is not negligible, so that a difference equal to or less than a noise level ΔN(t) is not able to be regarded as being significant (refer to 3222). Though various kinds of noise, such as dark current noise, 1/f noise, and thermal noise, generally exist, greatest noise in measurement of the number of photons is shot noise. The shot noise proportional to √N normally accompanies the detected number of photons N (average value). Thus, it is necessary to consider that the count number NCα(t) basically has noise proportional to √NCα(t). In particular, in a case where a significantly large signal needs to be found for the background light, only a signal larger than the count number NC1(t) by the noise level $\Delta N(t)=A \cdot \sqrt{NC1(t)}$ is able to be regarded as a significantly large signal. As a stricter condition, $\Delta N(t)=A \cdot \sqrt{NC1(t)}+B$ may be used. In the aforementioned formula, A≥1 and B≥0 (A and B in FIG. 9(b) are unrelated constants). By increasing A, erroneous detection that a signal by the shot noise is erroneously regarded as an object is able to be reduced. For reducing such erroneous detection to a negligible level, A is preferably 3 or more, and more preferably 4 or more. B is a noise component, such as dark current noise, other than the shot noise.

Though NC1(t) that does not include the reflection light of the pulse light but includes only the background light signal is used above to decide the noise level ΔN(t), the noise level ΔN(t) may be decided by another method. For example, NC2(t) to NCγ(t) are measured without measuring NC1(t), and on the basis of an average value Ave (NCα(t)) of NC2(t) to NCγ(t), calculation may be performed as follows:

$$\Delta N(t)=A \cdot \sqrt{Ave(NC\alpha(t))}+B.$$

In many cases, the number of ones including the reflection light signal of the pulse light among NC2(t) to NCγ(t) is 1 or 2, and most of them include only the background light signal. Thus, Ave (NCα(t)) extremely close to an average value of the background light. As γ increases, a difference between the average value of the background light signal and Ave (NCα(t)) is reduced. Further, from a different point of view, since the aforementioned formula evaluates ΔN(t) largely, ΔN(t) is estimated largely, thus making it possible to reduce erroneous detection.

However, since a circuit scale increases and a calculation time becomes long when a square root is strictly obtained, substitution with an approximate value is also possible. For example, an approximation method is also usable in such a manner that, when a most significant bit of the count number NC1(t) is in a kth digit, the number having a most significant bit in a k/2th digit (rounded up when k is an odd number) or the number which has a most significant bit in a k/2th digit (rounded up when k is an odd number) and whose lower is 1 is set as the noise level ΔN(t).

In algorithm of FIG. 10, a maximum value of the count number NCα(t) is searched for first. In a loop from step S240 to step S244, α indicating the maximum value is obtained and a value thereof β is decided. Next, whether or not a difference between a count number NCβ(t) and the count number NC1(t) is larger than ΔN is checked (refer to S245). When being not larger, it cannot be said that the count number NCβ(t) is significantly larger than the count number NC1(t), so that a result indicated by step S256 is obtained as the decision of the distance. When the difference between the count number NCβ(t) and the count number NC1(t) is larger than ΔN, a larger one of a count number NC(β+1)(t) and a count number NC(β−1)(t) is then selected and a value thereof α is replaced with (refer to S246 to S248). Next, whether or not a difference between a count number NCη(t) and the count number NC1(t) is larger than ΔN is checked (refer to S249). When being not larger, it cannot be said that the count number NCη(t) is significantly larger than the count number NC1(t), so that a result indicated by step S250 is obtained as the decision of the distance. Next, in accordance with a magnitude relationship between β and η (refer to S252), a distance and the like are calculated by formulas of step S253 and step S254. In the foregoing algorithm, a distance having highest reliability is indicated. A finally obtained result is stored in a memory as distance information D(K,j), two-dimensional image information (background light signal) G1(K,j), and two-dimensional image information (pulse light reflection light signal) G2(K,j) and are output to outside (refer to S251).

In this manner, the signal processing circuit DS has a function of calculating and storing the distance information D(K,j) and the two-dimensional image information G1(K,j) and G2(K,j) and outputting them to the external system 400. However, a specific calculation method is not limited thereto and various kinds of algorithm are able to be adopted.

In the invention, the pixel storage element Mx(j) is able to perform, in parallel, a function of counting an electrical pulse detecting a photon and a function of reading a counting result. Therefore, there is no case where a measurement result is not able to be extracted until signal accumulation in each row ends, and even in the middle of signal accumulation in each row, a measurement result is able to be extracted. For example, when a frame frequency is 30 Hz and the number of rows M of the pixels of the light receiving unit 154 is 40, a time of 1/1200 sec is able to be used for acquisition of data in each of the rows. When a pulse light emission cycle is 190 kHz, light emission of 158 pulses is able to be integrated to obtain data of one row. When the object 11 is at a close distance, data is able to be obtained even through light emission of one pulse in some cases. On the other hand, for the remote object 11, data is not able to be obtained unless a lot of data of pulse light emission are integrated. Accordingly, when the measurement result is obtained in the middle, information about the object 11 close to the three-dimensional image element 153 is able to be output earlier. That is, an object nearest an automobile or robot mounted with the three-dimensional image element 153 is detected even 1/30 second earlier and an alarm is issued to a control system of the automobile or robot, so that a collision is able to be prevented. A situation where a relative speed to the object 11 at a close distance of several m reaches 100 km per hour is difficult to be caused, and in a case of 30 km per hour, even though a moving distance in 1/30 second is about 30 cm and the time is short, a possibility of avoiding a collision is able to be increased.

In the two-dimensional image information $G1(i,j)$ and $G2(i,j)$, the two-dimensional image information (background light signal) $G1(i,j)$ is by the background light and is useful for recognizing a shape or the like of the object 11. In particular, in a case where information from a normal image sensor is used in combination, both data are compared so that the object 11 common in the both data is specified, thus making it possible to acquire correspondence between the recognition of the object 11 and a distance to the object 11. Further, in a case where the distance is difficult to be specified due to a great difference, proximity of the object 11 is able to be determined by tracing lapse of time of the two-dimensional image information (pulse light reflection light, signal) $G2(i,j)$. That is, when a value of the two-dimensional image information (pulse light reflection light signal) $G2(i,j)$ significantly increases, the object 11 of the pixel (i,j) is proximate, and when the value decreases, the object 11 is remote. The two-dimensional image information (pulse light reflection light signal) $G2(i,j)$ may be compared between continuous frames or separate frames or the comparison may be performed every light emission of multiple or single pulse.

The signal processing circuit DS may perform control about by what procedure the fan-like pulse light 124 is to be radiated (row selection) and in what order of columns calculation is to be performed for an array of the pixels Px(i,j) in m rows and n columns, or may have a memory therefor. Further, control of a timing when a photon detection signal of a pixel Px(i,j) is counted may be performed. An example thereof includes control in which an activation time of the signal T1 is several multiples of an activation time of another signal Tα to measure the signal of the background light with high accuracy. Moreover, the signal processing circuit DS may control a timing when the fan-like pulse light 124 is generated or a timing when the pixel Px(i,j) is activated. For example, in order to measure the background light described above, the pixel Px(K,j) is activated, the count number is accumulated in the binary counter BC1 during the time width ΔT1, and when the time width ΔT1 lapses, a signal is transmitted to the pulse light illumination system 110 through the control circuit 160 so as to perform pulse light emission. Moreover, when the time width ΔT1 lapses, the signal T2 is activated.

The signal storage processing unit 155 or the control circuit 160 may have a memory in which at least the distance information D(i,j) of all the pixels and the two-dimensional image information $G1(i,j)$ and $G2(i,j)$ are accumulated. These pieces of information obtained by the signal processing circuit DS may be sequentially accumulated in the memory, and output to the external system 400 through the control circuit 160 in accordance with a request of the external system 400. Moreover, in a case where the memory even for a plurality of frames is provided, results of comparison between the frames and calculation may be further output.

(Effect Verification)

In accordance with the invention described above, a test model was created and characteristics thereof were evaluated. As the pulse light illumination system 110, one VCSEL with a peak wavelength of 945 nm was used as the light emitting element 122 and was driven so that light was emitted with a pulse peak output of 80 W and a pulse full width at half maximum of 5 nsec. For the fan-like light radiation system 123, a collimator lens was used as the collimate light generator 130 and incidence was performed on a MEMS mirror (one-dimensional scanning device 131) at an angle of 35 degrees. Laser light reflected in the horizontal direction was incident on a Powell lens (fan-like beam generator 132) with an aperture of 8.9 mm and spread in a fan shape with the horizontal radiation angle θh=90 degrees. The beam thickness Δθ of the laser light (fan-like pulse light 124) output from the Powell lens was almost 1.5 degrees. A plane of the MEMS mirror is inclined at 45 degrees with respect to the horizontal plane and the laser light in the fan shape is radiated in the horizontal direction while no current flows in the MEMS mirror. When the mirror was caused to oscillate up and down by ±5 degrees from such a state, the laser light was caused to oscillate in the vertical direction by ±10 degrees and almost uniform radiation in a range of the vertical radiation angle θv=20 degrees was realized. Since dispersion of angle setting of the MEMS mirror was ±0.2 degrees, dispersion of an output direction of the laser light was ±0.4 degrees, and a sufficient margin was secured for angle resolution 0.5 degrees for one pixel.

At a distance of 30 m from the pulse light illumination system 110, average radiation intensity of a radiation region was 210 μW/cm$^2$ and dispersion in the horizontal direction was ±10% or less. A repetitive light emission frequency of a laser pulse was 190 kHz in consideration of a condition for a class 1. Image acquisition of 30 frames per second was assumed so that data is able to be accumulated for light emission of 150 laser pulses to the maximum in one frame.

As the imaging optical system 151 of the light receiving system 140, a lens with a focal distance of 4.5 mm, an F-number of 1.8, and an effective diameter of 2.5 mm was used. Used as the optical band-pass filter 152 was an interference filter for which a central wavelength was selected so that a peak wavelength of laser and a center value of a transmission band match at a room temperature. About the interference filter, as illustrated in FIG. 1, a hemisphere dome made of resin that is transparent to an infrared ray was provided at the front of the imaging optical system 151 as the protection cover 150, and the interference filter was formed in an inner surface of the protection cover 150. A diameter of the hemisphere was 15 mm.

The interference filter had a full width at half maximum of the transmission band of 10 nm and an average transmittance of 55%. Since temperature dependence of the light emission peak wavelength of the VCSEL laser was 0.07 nm/K and the center value of the transmission band of the interference filter was 0.025 nm/K, a relative deviation between the laser peak wavelength and the center value of the transmission band of the interference filter was ±2.8 nm at 85° C. to −40° C. Even including the full width at half maximum of the light emission peak of the laser of 1 nm, the deviation was within the width of the transmission band of 10 nm so that usage was enabled without problems even when no temperature control was performed. It is important that the light emission peak wavelength of the light emitting element 122 and the center value of the transmission band of the optical band-pass filter 152 match near a temperature at a center of a temperature zone for usage.

The light receiving unit 154 of the three-dimensional image element 153 was constituted by pixels Px(i,j) with a square of 50 μm so as to have 7.2 k (7200) effective pixels in total: 180 effective pixels in the horizontal direction and 40 effective pixels in the vertical direction. An effective part of the light receiving unit 154 is 9 mm×2 mm=18 mm².

In a pixel Px(i,j), seven circular SPADs 180 each having an effective detection region with a diameter of 10 μm were arranged as illustrated in FIG. 5. Each of the SPADs 180 is provided with the micro lens 181 with a bottom size of 15 μm. A height of the micro lens 181 was about 10 μm. A fill factor of the pixel Px(i,j) was 22%. Each of the SPADs 180 was operated with the deadtime of 20 nsec. An effective quantum efficiency of the SPAD 180 having the micro lens 181 was 10%. An average of the number of received photons by the background light, which was measured by placing a white plate whose reflectivity to infrared light with a wavelength of 945 nm was 50% at midday of fine weather, was 0.29 per 100 nsec in one SPAD 180. Thus, an average of the detected number of photons by the background light in all the seven. SPADs 180 was 1.9 per 100 nsec. In a case of counting with a pulse having a width of 1.0 nsec, a plurality of photons are detected almost at the same time and a possibility of under count is about 2%, but such a numerical value does not greatly affect a counting result.

The signal line Lx(j) connecting each of the pixels Px(i,j) and the corresponding pixel storage element Mx(j) is arranged between the light receiving unit 154 and the signal storage processing unit 155 of the three-dimensional image element 153. A length thereof is about 2.5 mm. Since a wire delay time depends on the parasitic capacitance of the signal line Lx(j), no other wire was provided around the signal line Lx(j) in order to minimize the delay time. As a result, the wire delay time was suppressed to about several tens psec. In addition, a delay time of the delay circuit 194 of the photon detection signal generation unit 191 of FIG. 7 was set as 100 psec. On the other hand, a delay time of the delay circuit 199 of the pixel signal output circuit 196 was set as 200 psec.

The pixel storage element Mx(j) has 42 binary counters BC1 to BC42. In consideration of a maximum signal value that can be counted by the binary counters BC1 to BC42, bits of the respective binary counters BC1 to BC42 were differentiated from 11 bits to 6 bits. The binary counters BC1 to BC7 had 11 bits, the binary counters BC8 to BC10 had 10 bits, the binary counters BC11 to BC14 had 9 bits, the binary counters BC15 to BC21 had 8 bits, the binary counters BC22 to BC28 had 7 bits, and the binary counters BC29 to BC42 had 6 bits. It is easy to design arrangement of binary counters all of which have the same number of bits. On the other hand, by adjusting the number of bits for each of the binary counters BC1 to BC42 as described above, there is an effect of capable of reducing an area of the pixel storage element Mx(j) by 25% to 28%. A total number of outputs from the binary counters BC1 to BC42 is 332. Since it is difficult to constitute the column signal line C(j) by 332 signal lines by parallel wiring, the column signal line C(j) is constituted by 11 signal lines and data is sequentially read for each of the binary counters BC1 to BC42. Selection of the binary counter BCα is performed when the memory selection circuit 163 activates the memory selection line Rm(α). The memory selection circuit 163 sequentially selects memory selection lines Rm(1) and Rm(2) to Rm(γ), and in accordance with activation of the memory selection lines Rm(1) and Rm(2) to Rm(γ), the output switch 211 sequentially transmits output data of the corresponding binary counters BC1 and BC2 to BCγ to the column signal line C(j). It is also possible to shorten a reading time by further increasing the number of signal lines of the column signal line C(j) and performing reading of a plurality of binary counters among the binary counters BC1 to BC42 at the same time.

The signal processing circuit DS was formed by only one calculation circuit to reduce a circuit scale. The signal processing circuit DS was constituted by a 12-bit microcomputer or the like that is used to access data of the binary counters BC1 and BC2 to BC42 stored in the buffer memory Bx(j) and perform distance calculation or the like. By using the microcomputer, algorithm used for distance extraction is able to be changed. By using the microcomputer with the number of bits (in this case, 11 bits) equal to or more than a maximum value of the numbers of bits of the binary counters BC1 to BC42, a speed of the distance extraction is able to be enhanced and the distance extraction of all pixels in one row is able to be performed in a time (about 5 μsec) during pulse light emission. When an existing microcomputer is used, a time period for design is shortened, but an area of the signal processing circuit DS increases and cost increases. Therefore, in order to reduce the area of the signal processing circuit DS and reduce cost, it is also possible to design a dedicated circuit.

The signal processing circuit DS has a memory (230 kb) with a capacity of 32 bits for each of the pixels. Thereby, accuracy of distance information D(K,j) is able to be improved by accumulating the two-dimensional image information (pulse light reflection light signal) G2(i,j) among frames, and by storing an integrated value thereof and comparing the integrated value to another measurement value or integrated value, approach and separation are able to be detected.

In a case of layout with 0.13 μm process, the area of the signal processing circuit DS was 2 mm×2 mm, the area of the pixel storage element Mx(j) was 50 μm×50 μm, an area of the buffer memory Bx(j) was 50 μm×40 μm, and a size of the three-dimensional image element 153 was 10 mm×4.5 mm. A non-volatile memory in which the algorithm for distance extraction and an operation condition such as scanning order of the pixel storage element Mx(j) are stored is also incorporated.

Figure 11:
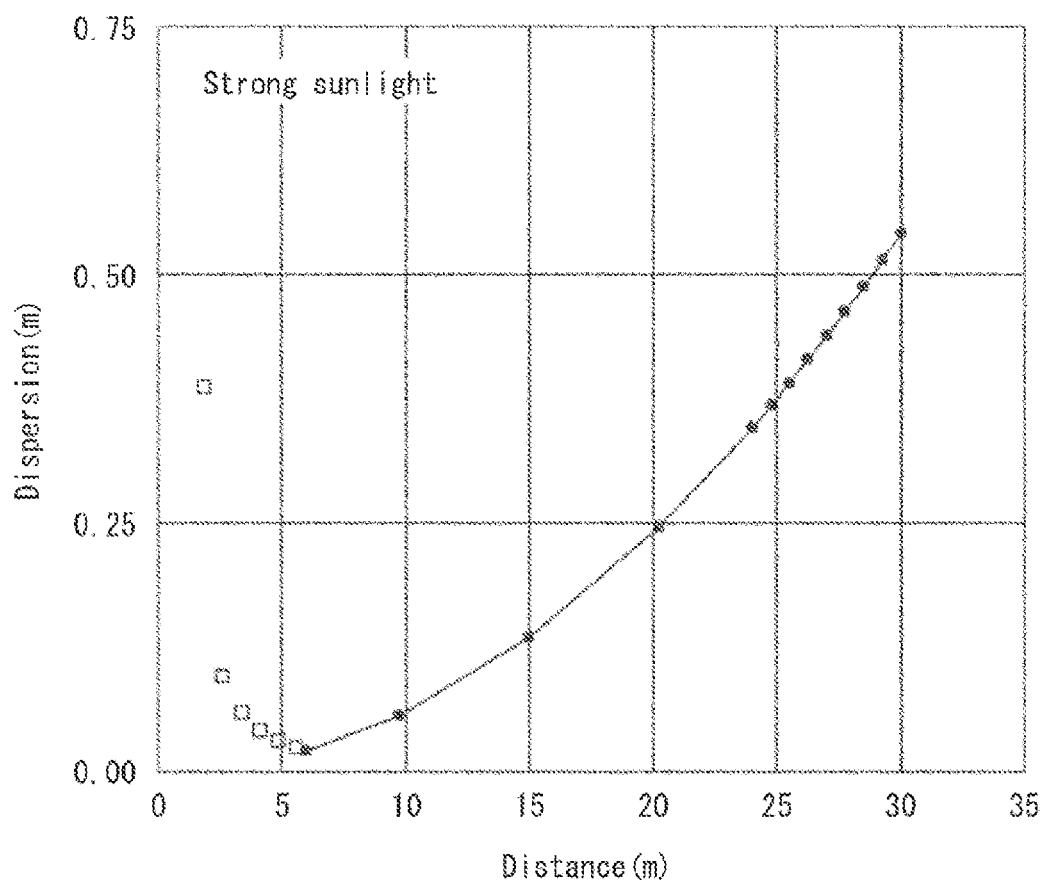
FIG. 11 is a graph illustrating a measurement error and measurement dispersion of the three dimensional image element according to Embodiment 1 of the invention.

By using the present optical radar device 100, a measurable range was checked under three conditions of fine weather, cloudy weather, and nighttime by using a white plate whose reflectivity to infrared light with a wavelength of 945 nm was 50% as the object 11. In daytime of fine weather, by integrating radiation of pulse light 150 times, the object 11 up to a distance of 30 m between the three-dimensional image element 153 and the object 11 was able to be captured. Measurement dispersion in a vicinity of the distance of 30 m was about 0.5 m. A relationship of the measurement dispersion and error to a distance is illustrated in FIG. 11. FIG. 11 is a graph illustrating a measurement error and measurement dispersion of the three-dimensional image element 153. In FIG. 11, a horizontal axis indicates an actual distance (unit: m) between the three-dimensional image element 153 and the object 11 and a vertical axis indicates an error (unit: m) of a measurement value of the actual distance. As illustrated by circles in FIG. 11, as the actual distance is short, the error is reduced. However, when the actual distance is 6 m or less, the error increases as illustrated by squares. This is because radiation intensity of the pulse light is high at a close distance so that the SPAD 180 is saturated comparatively and detection efficiency is lowered. Note that, a square portion indicates an error by which the distance is determined shortly and is not an error of recognizing a close object to be remote or a hazardous measurement result.

In cloudy weather, unless the other conditions were not changed, the error when the actual distance was in the vicinity of 30 m was improved to 15 cm. Similarly, in nighttime, the error was improved to 5 cm. Even in a case where it is difficult to monitor the surroundings by a normal camera video because a surrounding area is dark, for example, in nighttime, three-dimensional information of the surroundings, which also includes the distance information D(K,j), is able to be collected by the three-dimensional image element 153.

The present optical radar device 100 was installed at height of 60 cm from a road surface, a central optical axis defined by the one-dimensional scanning device 131 was matched with a horizontal plane, scanning was performed at an angular step of 0.5 degrees from 0 degrees to −10 degrees as a scanning angle of laser light relative to the horizontal plane, and then scanning was performed similarly at an angular step of 0.5 degrees from +0.5 degrees to +10 degrees. Through first measurement at 0 degrees, one positioned at height of 60 cm from the road surface, other than one whose reflectivity of an infrared ray was significantly low, was able to be detected when the distance between the three-dimensional image element 153 and the object 11, which was a longest measurement distance of the optical radar device 100, was within 30 m. Thereby, an object which is an obstacle to traveling of a vehicle and a pedestrian including a child is also able to be detected by first measurement of one frame. In a case where the scanning angle shifts to a minus side, when the angle reaches −1.5 degrees (first numerical value of the step of 0.5 degrees, which exceeds Arctan(0.6 m/30 m)), laser light hits the road surface within the distance of 30 m and detection of the road surface starts. At the angle of −10 degrees, the laser light hits the road surface at the distance of 3.5 m (=0.6 m/tan 10 degrees), so that a situation of the road surface within the distance of 30 m to 3.5 m is able to be observed. For example, a rock, a tree, a falling object, an animal, a carcass of an animal, a hole formed on the road surface, or the like, which is an obstacle to traveling of a vehicle, is able to be detected, so that utilization for risk avoidance is enabled. In scanning in which the angle is from +0.5 degrees to +10 degrees, a tree protruding on the road, a sign that is tilted, further, a load extending onto the road from a truck bed, or the like, at height of up to 5.28 m (=30 m×tan 10 degrees) is able to be detected, so that utilization for risk avoidance is enabled. The installation position and the scanning order of the optical radar device 100 are able to be appropriately selected in accordance with priority order in which various obstacles as described above are observed.

Embodiment 2

The present embodiment is the same as Embodiment 1 other than a difference that in measurement of each line (row), pulse light is radiated by changing power thereof in two stages so that a part at a close distance is firstly measured through radiation with low power and a whole is then measured with high power.

As described in Embodiment 1, the intensity of the pulse light is too high at the close distance and the light receiving system 140 is saturated so that correct distance measurement is not able to be performed. Thus, the intensity of the pulse light is firstly reduced to 10 W and integration measurement is performed ten times, and then, integration is performed 140 times with the power of 75 W similarly to Embodiment 1. After the integration for the first ten times, data accumulated in the pixel storage element Mx(j) is copied to the buffer memory Bx(j) and data processing is performed for the data in the buffer memory Bx(j). Distance data that is obtained is stored in the memory of the signal processing circuit DS. A result of performing measurement 140 times with high power may be directly integrated to a result of performing integration first 10 times with low power. Signal processing is performed similarly to Embodiment 1 for the pixel storage element Mx(j) in which final integration is performed.

Here, two types of signal processing results for the lower power and the high power are generated. Distance information D(i,j)l and distance information D(i,j)h are provided as the distance signal, two-dimensional image information G1($i,j$)l and two-dimensional image information G1($i,j$)h are provided as the two-dimensional image information G1($i,j$), and two-dimensional image information G2($i,j$)l and two-dimensional image information G2($i,j$)h are provided as the two-dimensional image information G2($i,j$). They are preferably selected as follows.

Distance information D(i,j)=D(i,j)l (D(i,j)l≤6 m)
  D(i,j)=D(i,j)h (D(i,j)l>6 m)
Background light signal: G1($i,j$)=G1($i,j$)h
Pulse light reflection light signal: G2($i,j$)=MAX (G2($i,j$)h, G2($i,j$)l×106)

6 m that is a determination criterion of the distance signal is to be changed depending on an operation condition of the optical radar device 100. A distance at which the light receiving system 140 starts to be saturated may be a determination distance. Since the background light is not related to the intensity of the pulse light, a final integration result may be used. In the pulse light reflection light signal, when the distance is close, the two-dimensional image information (pulse light reflection light signal) G2($i,j$)h does not indicate correct signal intensity because of the saturation of the light receiving system 140, and therefore, for such a part, the measurement result of the lower power is to be used by converting a difference of the power intensity and the number of times of integration. This means that X or Y that is larger is selected in MAX (X,Y). A conversion coefficient of 106 (=(140×75 W+10×10 W)/(10×10 W)) is a ratio of a total amount of radiated pulse light in measurement with the high power and measurement with the low power in the example described above, and is to be changed depending on an operation condition of the optical radar device 100.

As a result, even when the distance between the three-dimensional image element 153 and the object 11 is close to be from about 3 m to 0.75 m, the distance was able to be measured correctly. Measurement dispersion (error described above) at the distance of 3 m was about 15 cm. At, the distance of 1.5 m or less, an effect of saturation was seen, but the effect was about 10 cm.

By switching the power of the pulse light as described above, measurement from the close distance to the long distance is able to be performed with high accuracy. The present method is excellent particularly in that the object 11 at the close distance is able to be detected in an early stage of starting one frame without waiting for an end of one frame.

Embodiment 3

Figure 12:
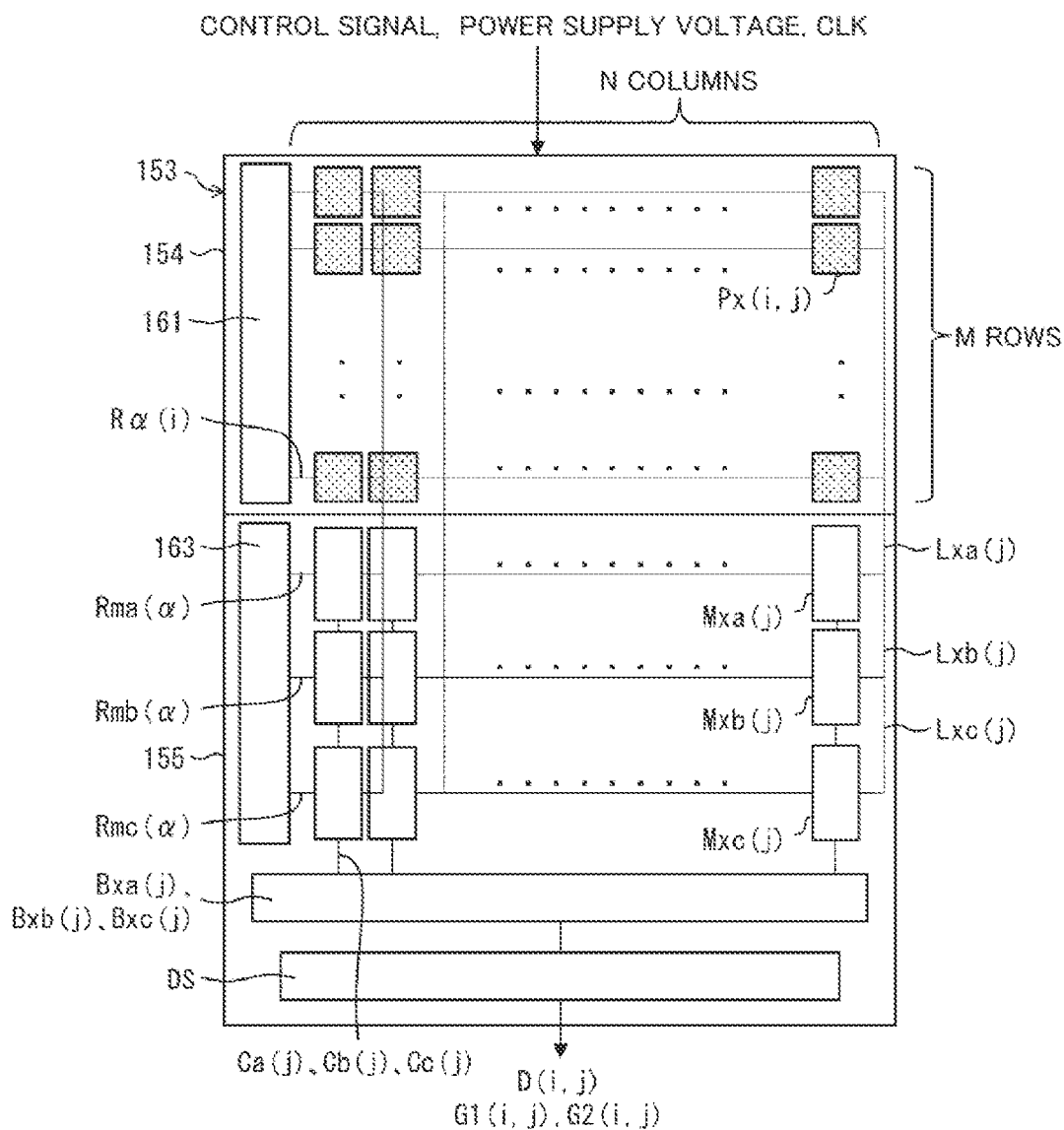
FIG. 12 is a schematic view of a three-dimensional image element that constitutes an optical radar device according to Embodiment 3 of the invention.
Figure 13:
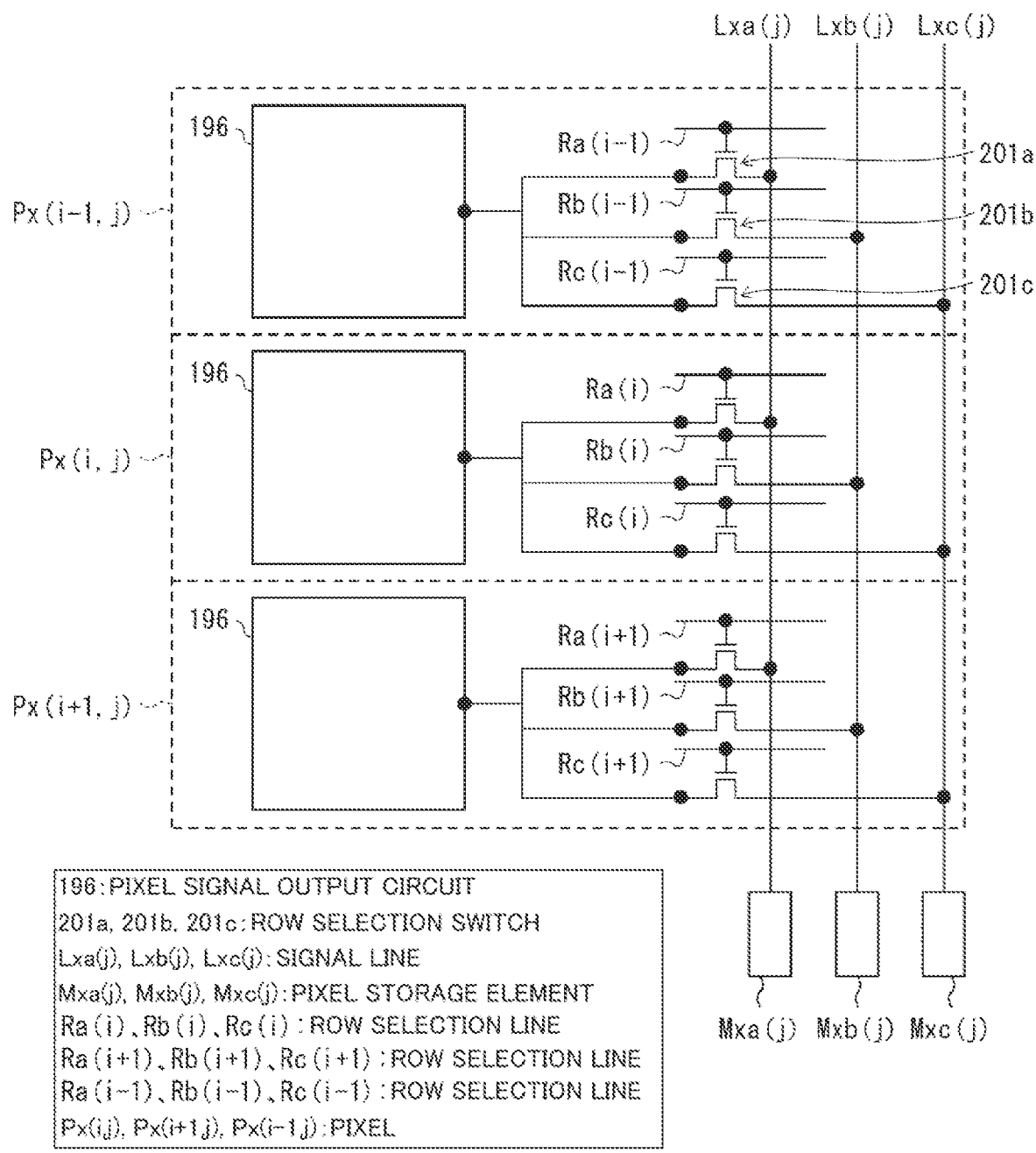
FIG. 13 is a schematic view illustrating connection of a pixel, signal lines, and pixel storage elements of the three-dimensional image element according to Embodiment 3 of the invention.

FIG. 12 is a schematic view of the three-dimensional image element 153 according to the present embodiment. FIG. 13 is a schematic view illustrating connection of the pixel Px(i,j), signal lines Lxa(j) to LxC(j), and pixel storage elements Mxa(j) to MxC(j) of the three-dimensional image element 153 according to the present embodiment.

A substantial difference of the present embodiment from Embodiment 1 is that a plurality of pixel storage elements Mx(j) are provided so that data of a plurality of pixels that are adjacent is able to be measured at the same time. In an example of FIG. 12, each column has three pixel storage elements Mxa(j), Mxb(j), and MxC(j). In a case where accuracy of angle control of the one-dimensional scanning device 131 is low and correspondence between fan-like pulse light 124-α and a pixel Px(α,j) is disturbed, the beam thickness Δθ is inevitably increased to increase a margin in the configuration of Embodiment 1. However, this causes reduction of the radiation intensity of the pulse light at the object 11. Alternatively, it becomes necessary to use the light emitting element 122 with higher output. This results in lowering of detection sensitivity or cost increase. In the present embodiment, the beam thickness Δθ is kept small and the light radiation intensity is increased, and angle dispersion of the one-dimensional scanning device 131 is able to be covered by observing adjacent pixels Px(i,j) at the same time. Thus, in the present embodiment, by relaxing specification related to the one-dimensional scanning device 131, cost thereof is able to be reduced. Though the three pixel storage elements Mxa(j), Mxb(j), and MxC(j) are provided in each column in the present embodiment, the number thereof may be two or four or more.

The pulse light illumination system 110 of the present embodiment has the changed collimate light generator 130 and a reduced beam thickness Δθ of 0.5 degrees, but is the same as that of Embodiment 1 in the others. The light receiving system 140 is the same as that of Embodiment 1 other than that a configuration of the three-dimensional image element 153 is different. In the light receiving unit 154, as illustrated in FIG. 13, in order to connect three pixels Px(i−1,j), Px(i,j), and Px(i+1,j) adjacent in a row direction to the three pixel storage elements Mxa(j), Mxb(j), and Mxc(j), the row selection line is also increased to three row selection lines Ra(i), Rb(i), and Rc(i) and the signal line is also increased to three signal lines Lxa(j), LXb(j), and Lxc(j). The signal lines Lxa(j), LXb(j), and Lxc(j) are respectively connected to the pixel storage elements Mxa(j), Mxb(j), and Mxc(j). As switches that supply outputs of pixel signal output circuits 196 of the respective pixels(i,j) to the signal lines Lxa(j), LXb(j), and Lxc(j), row selection switches 201a, 201b, and 201c are provided and the row selection switches 201a, 201b, and 201c are respectively opened or closed by the row selection lines Ra(i), Rb(i), and Rc(i). For example, in a case where the pixels Px(i−1,j), Px(i,j), and Px(i+1,j) are selected, the row selection circuit 161 controls all row selection lines Ra(i) so that row selection lines Ra(i−1), Rb(i), and Rc(i+1) are activated (Vcc in FIG. 13) and the others are deactivated (0 V in FIG. 13). Thereby, observation data of the pixel Px(i−1,j) is accumulated in the pixel storage element Mxa(j), observation data of the pixel Px(i,j) is accumulated in the pixel storage element Mxb(j), and observation data of the pixel Px(i+1,j) is accumulated in the pixel storage element MxC(j).

The pieces of observation data of the pixel storage elements Mxa(j), Mxb(j), and MxC(j) are copied to buffer memories Bxa(j), Bxb(j), and BxC(j) through column signal lines Ca(j), Cb(j), and Cc(j), respectively. The memory selection circuit 163 that selects the binary counters BC1 to BCγ of each of pixel storage elements Mxα(j) when data of a pixel storage element Mxα(j) is transferred to a buffer memory Bxα(j) through a column signal line Cα(j) has substantially no difference from that of Embodiment 1. It may be considered that three circuits which are the same are arranged in parallel. A memory selection line Rmα(β) that drives the output switch 211 of each of the pixel storage elements Mxα(j) also has substantially no difference from that of Embodiment 1. Since all are processed in parallel, amounts of the pixel storage element and the buffer memory increase, but a time required for measurement is not elongated or a frame frequency is not reduced.

Figure 14:
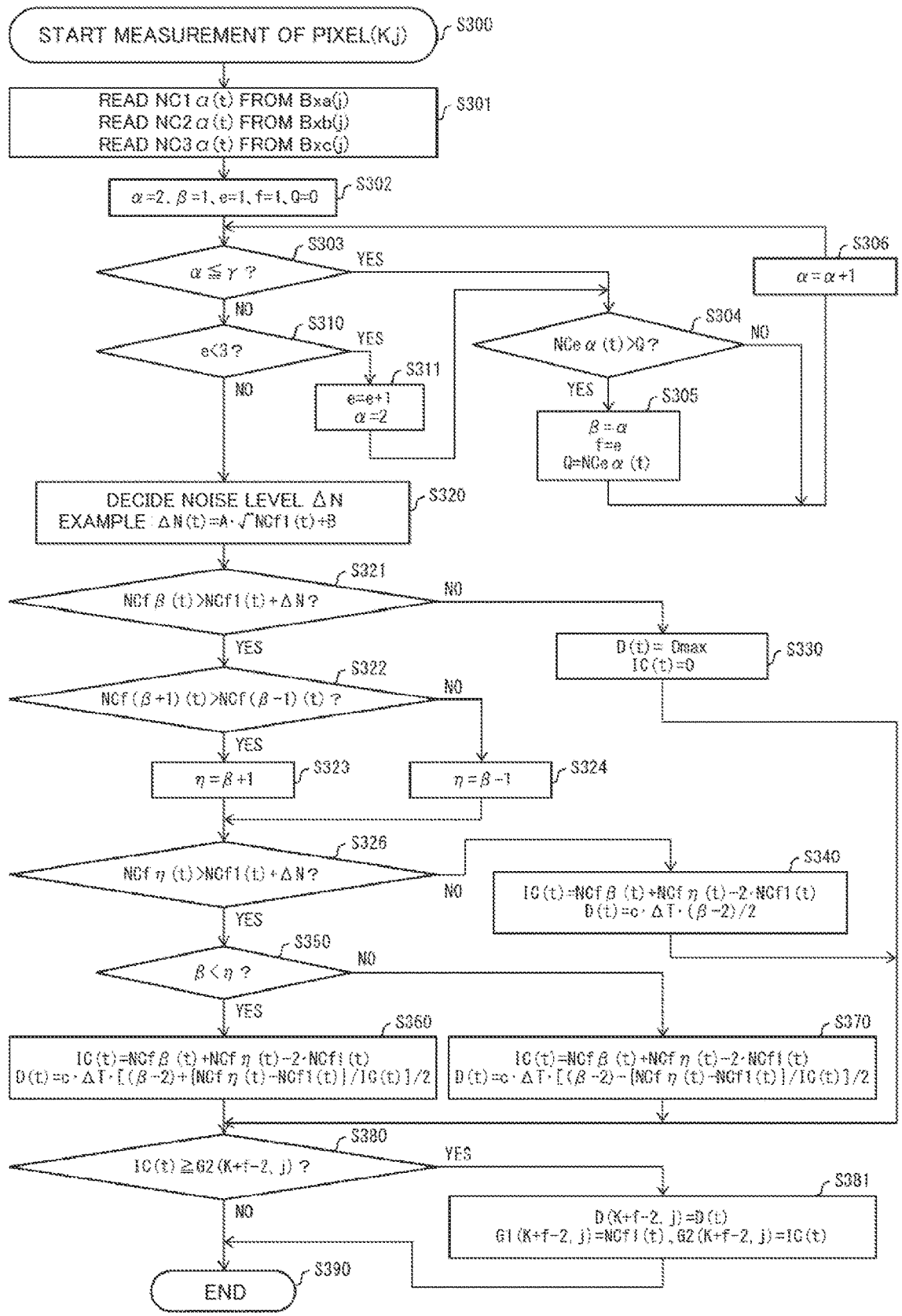
FIG. 14 is a flowchart illustrating a signal processing procedure of a signal processing circuit of the three-dimensional image element according to Embodiment 3 of the invention.

Various kinds of algorithm are applicable to a method of extracting the distance information D(i,j) and the two-dimensional image information G1(*i,j*) and G2(*i,j*) from the pieces of data copied to the buffer memories Bxa(j), Bxb(j), and BxC(j). A simplest example will be described below. FIG. 14 is a flowchart illustrating a signal processing procedure of the signal processing circuit DS of the three-dimensional image element 153 according to the present embodiment. The processing procedure illustrated in FIG. 14 has basically the same content as that of FIG. 10. That is, the pieces of data of the buffer memories Bxa(j), Bxb(j), and BxC(j) are respectively read as count numbers NC1α(*t*), NC2α(*t*), and NC3α(*t*) (S301), a maximum value is found from among them (S302 to S311), the value is used as a count number NCfβ(t) to decide a noise level from a count number NCf1(*t*) (S320), and distance information D(t) and a pulse light reflection light signal IC(t) are decided from the count number NCfβ(t), a count number NCf(β−1)(t), or a count number NCf(β+1)(t) (S321 to S370). In a case of f=2, D(K,j)=D(t) and G2(K,j)=IC(t) are provided, in a case of f=1, D(K−1,j)=D(t) and G2(K−1,j)=IC(t) are provided, and in a case of f=3, D(K+1,j)=D(t) and G2(K+1,j)=IC(t) are provided. The same is also applied to a case of the two-dimensional image information G1(K,j) (refer to S381). Step S380 is provided to prevent that a value that has been already measured is overwritten in a specific case where a variation of the one-dimensional scanning device 131 is great and two successive scanning angles are reversed.

In a case where the beam thickness Δθ is 0.5 degrees and the pixel angle resolution is 0.5 degrees, even when the fan-like pulse light 124 has dispersion of ±0.83 degrees to the maximum, at least 34 (=(0.5×2−0.83)/0.5) % of a light amount is radiated onto the object 11 corresponding to any of the pixels Px(i,j) so that a sufficient signal amount is able to be secured. In Embodiment 1, the beam thickness Δθ is 1.5 degrees and three times as large as that of the present embodiment, and when a laser with the same output is used, the radiation intensity of the pulse light at the object 11 in the present embodiment is three times larger, so that an equivalent minimum light amount (34%×3=102%) is able to be realized in a margin of ±0.83 degrees. An angle margin of the fan-like pulse light 124 in Embodiment 1 is ±0.4 degrees and an angle margin almost twice the angle margin is able to be secured in the present embodiment.

Embodiment 4

Figure 15:
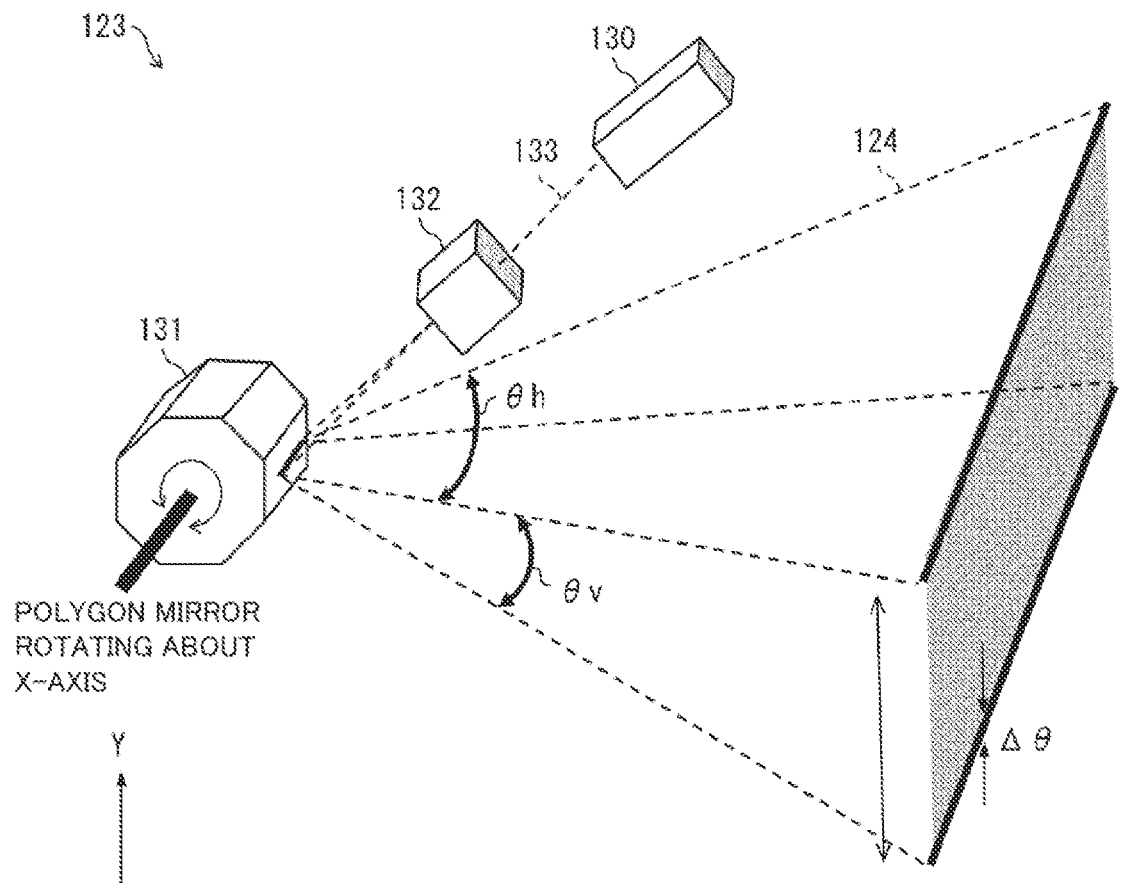
FIG. 15 is a schematic view illustrating a configuration of a fan-like light radiation system that constitutes an optical radar device according to Embodiment 4 of the invention.

FIG. 15 is a schematic view illustrating a configuration of the fan-like light radiation system 123 according to the present embodiment. The present embodiment is the same as Embodiment 1 other than that the configuration of the fan-like light radiation system 123 that is a part of the pulse light illumination system 110 is different.

The fan-like light radiation system 123 in the present embodiment is illustrated in FIG. 15. A difference from the fan-like light radiation system 123 of Embodiment 1 is that the fan-like beam generator 132 that, after the collimate light generator 130 shapes light from the light emitting element 122 into almost parallel spot light 133 (in the Y-Z plane), makes the spot light 133 spread in the fan shape is arranged so that the one-dimensional scanning device 131 uses the light spread in the fan shape to perform scanning in the vertical direction (Y direction). An advantage of the present configuration is that an incidence angle of the light on the fan-like bean generator 132 is always fixed, so that intensity distribution in the horizontal direction and the vertical direction of the fan-like pulse light 124 has less dispersion in the target field of view 10. The present embodiment has an advantage that, in a case where the Powell lens is used as the fan-like beam generator 132, when an incidence angle on the Powell lens changes, the horizontal radiation angle θh and/or the beam thickness Δθ slightly change/changes due to a deflection angle in the vertical direction, but such a change is not generated. As a result, it is possible to increase uniformity of the fan-like pulse light 124, increase pulse light radiation intensity at the object 11, and widen a measurement range.

The one-dimensional scanning device 131 is also able to use a MEMS mirror element similarly to Embodiment 1, but uses a polygon mirror in FIG. 15. Differently from Embodiment 1, pulse light is spread in the fan shape in front of the one-dimensional scanning device 131 so that a larger reflection plane than that of Embodiment 1 is required, and a polygon mirror is more advantageous in terms of cost in some cases. The control circuit 160 controls a rotation angle of the polygon mirror and performs synchronous control of the angle of the mirror and the light receiving system 140 so that a signal from the object 11 irradiated with the fan-like pulse light 124 is able to be detected.

Embodiment 5

Figure 16:
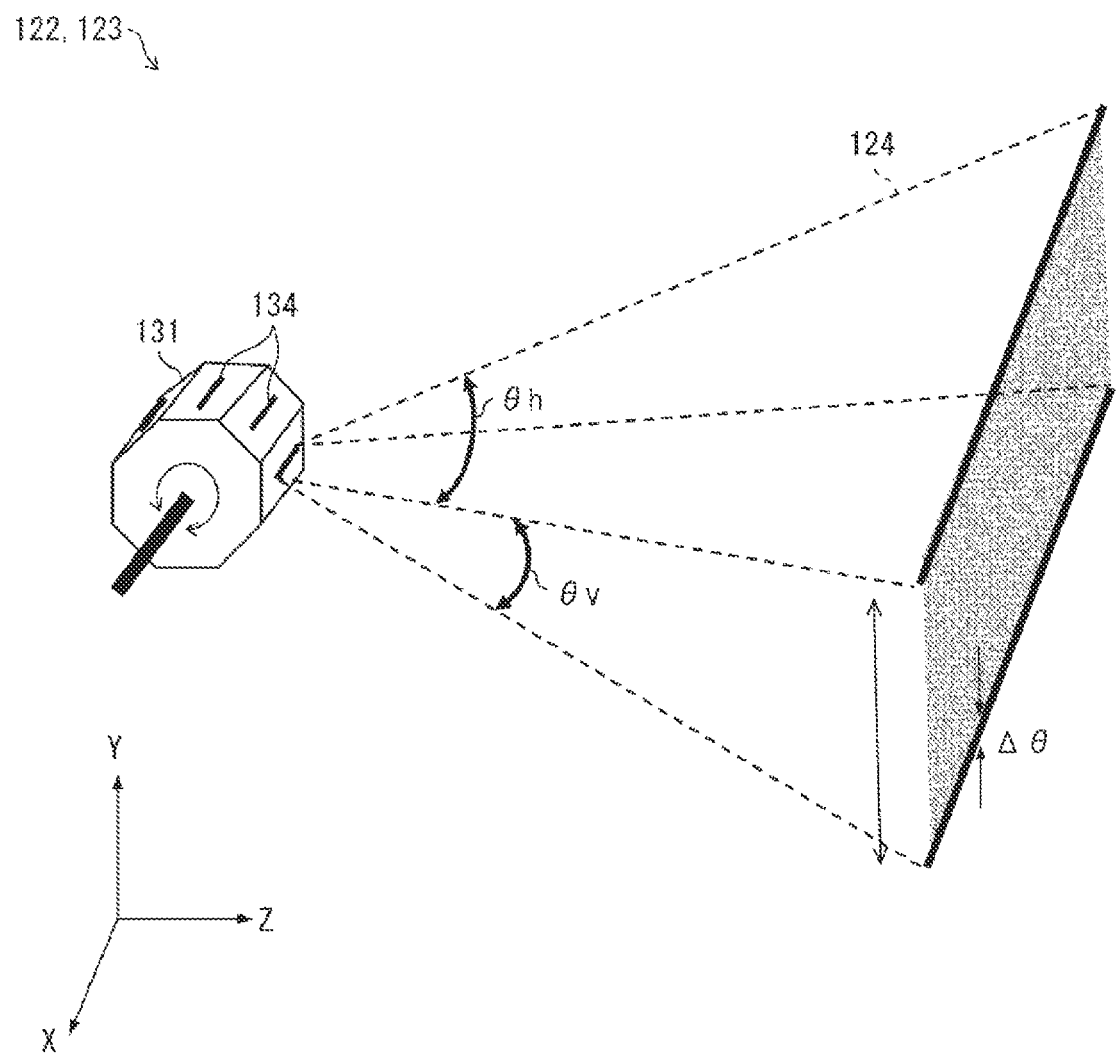
FIG. 16 is a schematic view illustrating a configuration of a light emitting element and a fan-like light radiation system that constitute an optical radar device according to Embodiment 5 of the invention.

FIG. 16 is a schematic view illustrating a configuration of the light emitting element 122 and the fan-like light radiation system 123 according to the present embodiment. The present embodiment is the same as Embodiment 1 other than that the configuration of the light emitting element 122 and the fan-like light radiation system 123 that are a part of the pulse light illumination system 110 is different.

FIG. 16 illustrates the light emitting element 122 and the fan-like light radiation system 123 in the present embodiment. A difference from Embodiment 1 is that a fan-like laser light source 134 that emits the fan-like pulse light 124 is arranged in one or more planes of a rotating body (with an X-axis as a rotational axis) that is the one-dimensional scanning device 131. The fan-like laser light source 134 is, for example, a combination of a laser light source (light emitting element 122), a collimate lens (collimate light generator 130), and a Powell lens (fan-like beam generator 132). Alternatively, one in which many laser chips are linearly arrayed to perform light emission at the same time may be used. In the one-dimensional scanning device 131, one or more fan-like laser light sources 134 as described above are arranged around the rotational axis so that a scanning angle in the vertical direction is able to be controlled by control of a rotation angle.

An advantage of the present configuration is that the pulse light illumination system 110 is able to be reduced in size by simplifying arrangement of a light path.

Embodiment 6

A difference of the optical radar device 100 of the present embodiment from those of the foregoing embodiments is that a sensor that measures a distance to the object 11 by a ToF (Time-of-flight) system is mounted instead of the three-dimensional image element 153 that constitutes the light receiving system 140. The three-dimensional image element 153 of Embodiment 1 is not essential for providing an advantage that the field of view 10 in a rectangular shape is scanned with the fan-like pulse light 124 that is spread in a long-side direction so that the object 11 such as a pedestrian or an obstacle is found at an initial stage of scanning where scanning of the whole of the field of view 10 is not completed. For example, a circuit in which the signal storage processing unit 155 performs signal processing by a TCSPC system while using a SPAD array like the light receiving unit 154 of the three-dimensional image element 153 of Embodiment 1 may be used. A system in which the light receiving unit 154 drives an avalanche photodiode not in a Geiger mode but in a current amplification mode and the signal storage processing unit 155 detects an increase or decrease of a signal current transmitted from each of the pixels Px(i,j) of the light receiving unit 154 to thereby measure a flight time may be provided. In any system, the light receiving unit 154 has pixels arranged in a two-dimensional array so as to cover the target field of view 10 and the signal storage processing unit 155 has a flight time measurement circuit corresponding to a group of pixels in one row arranged in a long-side direction of the two-dimensional array.

It should be understood that embodiments and examples disclosed herein are illustrative and non-restrictive in every respect. The scope of the invention is defined by the scope of the claims, rather than the description above, and is intended to include meaning equivalent to the scope of claims and all modification falling in the scope.

CONCLUSION

A three-dimensional image element according to an aspect 1 of the invention includes: a light receiving unit in which pixels each including an avalanche photodiode (SPAD 180) that detects light in a Geiger mode are arranged in a two-dimensional matrix pattern; a pixel storage element to which an electrical pulse is supplied from each of pixels that constitute a column of the pixels; and a signal processing circuit that reads data accumulated by the pixel storage element and acquires, for each of the pixels, at least distance information indicating a distance to an object, in which the pixel storage element has a plurality of binary counters that integrate the number of electrical pulses at mutually different timings, and the reading of the data by the signal processing circuit is able to be performed in parallel with the integration.

According to the aforementioned configuration, since the pixel storage element is able to be realized with a small area, many pixel storage elements are able to be mounted in the three-dimensional image element and many pieces of image information are able to be processed at a time. Further, the signal processing circuit is able to acquire a progression of a count of the number of electrical pulses. Accordingly, it is possible to detect an object at a close distance in a wide field of view and detect the distance before a final result of counting the number of electrical pulses is acquired.

In the three-dimensional image element according to an aspect 2 of the invention, the number of columns of the pixels in the light receiving unit is larger than the number of rows of the pixels in the light receiving unit, in the aspect 1.

According to the aforementioned configuration, in an environment there are many objects that are wide in a row direction, by acquiring data of a first one or several rows, an object in a wide field of view covered by many columns is able to be detects, thus making it possible to detect the object at high speed and with high probability.

In the three-dimensional image element according to an aspect 3 of the invention, the light receiving unit, the pixel storage element, and the signal processing circuit are formed on a silicon substrate in a monolithic manner, in the aspect 1 or 2.

According to the aforementioned configuration, by manufacturing the light receiving unit, the pixel storage element, and the signal processing circuit as one chip, the three-dimensional image element that has high accuracy and high reliability is able to be produced at low cost.

In the three-dimensional image element according to an aspect 4 of the invention, each of the pixels includes a plurality of avalanche photodiodes that detect light in a Geiger mode, in any of the aspects 1 to 3.

According to the aforementioned configuration, when the pixel includes the plurality of avalanche photodiodes, lowering of detection efficiency due to a deadtime (lowering of detection efficiency resulting from that a next photon is able to be detected after a certain photon is detected) is able to be prevented. Accordingly, according to the aforementioned configuration, measurement sensitivity of the three-dimensional image element is able to be enhanced. In particular, an object at a close distance has a large signal amount and accuracy of distance measurement is deteriorated because of lowering of the detection efficiency due to the deadtime, so that the accuracy of distance measurement at the close distance is able to be improved by the aforementioned configuration.

In the three-dimensional image element according to an aspect 5 of the invention, the number of bits of a digital signal processed by the signal processing circuit is equal to or more than a maximum number of output bits of each of the plurality of binary counters, in any of the aspects 1 to 4.

According to the aforementioned configuration, calculation processing is simplified and a result is able to be obtained with a small number of steps, thus making it possible to reduce a processing time and power consumption.

An optical radar device according to an aspect 6 of the invention includes the three-dimensional image element according to any one of the aspects 1 to 5, and the optical radar device includes: a pulse light illumination system that has a light emitting element that emits pulse light, an optical scanning unit (one-dimensional scanning device 131) that performs scanning with the pulse light in a direction parallel to a first plane, and an optical conversion unit (fan-like beam generator 132) that converts the pulse light into fan-like pulse light that is spread in a direction vertical to the first plane; and an imaging optical system that images and projects light, which is from at least a part of a region to which light is radiated from the pulse light illumination system, onto the light receiving unit of the three dimensional image element through an optical band-pass filter.

According to the aforementioned configuration, it is possible to perform radiation from one end to the other end in the direction vertical to the first plane all at once (all pixels in the same row are to receive light), so that a radiation range of each unit radiation is able to be widened. Further, the aforementioned configuration makes it possible to keep high light radiation intensity as compared to that of single-radiation type.

In the optical radar device according to an aspect 7 of the invention, a spread angle (horizontal radiation angle $\theta h$) of the fan-like pulse light in a fan plane is greater than an angle (vertical radiation angle $\theta v$) of the scanning, in the aspect 6.

According to the aforementioned configuration, in an environment where there are many objects that are wide in a direction vertical to a fan plane, the object is able to be detected at high speed and with high probability.

In the optical radar device according to an aspect 8 of the invention, the first plane is a plane including a vertical line (Y axis), in the aspect 6 or 7.

Since most objects on land mainly extend upwardly from a ground, by using fan-like pulse light that is spread in a horizontal plane, the object is able to be detected at high speed and with high probability without waiting for scanning of a whole of a target field of view. Thus, according to the aforementioned configuration, it is possible to sense danger at an earlier stage in usage on land.

In the optical radar device according to an aspect 9 of the invention, a time width in which at least one of the binary counters of the three-dimensional image element integrates the number of electrical pulses is almost identical with a pulse width of the pulse light or shorter than the pulse width of the pulse light, in any of the aspects 6 to 8.

According to the aforementioned configuration, when the time width for measurement and the pulse width are almost the same, it is possible to improve an SN ratio of a signal while enhancing time resolution by increasing power of the pulse light in an allowable range.

In the optical radar device according to an aspect 10 of the invention, at least one of the binary counters of the three-dimensional image element integrates the number of electrical pulses before light emission of the pulse light, in any of the aspects 6 to 9.

According to the aforementioned configuration, it is possible to eliminate an effect of the pulse light to the maximum in measurement of intensity of background light. Further, according to the aforementioned configuration, by measuring the intensity of the background light over a longer time than a measurement time after light emission of the pulse light, a noise level of the intensity of the background light is able to be reduced. Thus, according to the aforementioned configuration, measurement accuracy of the intensity of the background light is enhanced and a variation of a measurement result is reduced.

In the optical radar device according to an aspect 11 of the invention, the three-dimensional image element is able to output, in addition to the distance information, an intensity signal of reflection light obtained when radiation light from the pulse light illumination system is reflected by the object and an intensity signal of light that does not include the reflection light, in any of the aspects 6 to 10.

In the optical radar device according to an aspect 12 of the invention, the optical radar device has a function of storing order of the scanning, causing the optical scanning unit to perform scanning with the pulse light in accordance with the stored order, and synchronously performing reading on the pixels in a corresponding row, in any one of the aspects 6 to 11.

According to the aforementioned configuration, scanning is performed from a part where an object at issue is likely to be detected depending on use, and it is not necessary to instruct scanning order from an external system for each frame, so that control of the optical radar device is able to simplified.

An optical radar device according to an aspect 13 of the invention includes: a pulse light illumination system that has a light emitting element that emits pulse light, an optical scanning unit that performs scanning with the pulse light in a direction parallel to a first plane, and an optical conversion unit that converts the pulse light into fan-like pulse light that is spread in a direction vertical to the first plane; and an imaging optical system that images and projects light, which is from at least a part of a region to which light is radiated from the pulse light illumination system, onto a light receiving unit of a sensor, which measures at least a distance to an object, through an optical band-pass filter.

According to the aforementioned configuration, a small-sized pulse light illumination system capable of scanning a wide range with linear pulse light having high intensity is able to be realized. Further, when a material or a circuit other than the three-dimensional image element according to an aspect of the invention is used as a sensor, a measurement range is able to be widened to a remote range by using a light emitting element and a light receiving element for light with a long wavelength to achieve lower intensity of background light.

In the optical radar device according to an aspect 14 of the invention, a spread angle of the fan-like pulse light in a fan plane is greater than an angle of the scanning, in the aspect 13.

According to the aforementioned configuration, in an environment where there are many objects that are wide in a direction vertical to the fan plane, the object is able to be detected at high speed and with high probability.

The invention is not limited to each of the embodiments described above, and may be modified in various manners within the scope indicated in the claims and an embodiment achieved by appropriately combining technical means disclosed in different embodiments is also encompassed in the technical scope of the invention. Further, by combining the technical means disclosed in each of the embodiments, a new technical feature may be formed.

REFERENCE SIGNS LIST 10 target field of view
100 optical radar device
110 pulse light illumination system
120 illumination system power source
121 light emitting element driving circuit
122 light emitting element
123 fan-like light radiation system
124 fan-like pulse light
130 collimate light generator
131 one-dimensional scanning device (optical scanning unit)
132 fan-like beam generator optical conversion unit)
133 spot light
134 fan-like laser light source
140 light receiving system
141 light receiving system power source
150 protection cover
151 imaging optical system
152 optical band-pass filter
153 three-dimensional image element
154 light receiving unit
155 signal storage processing unit
160 control circuit
161 row selection circuit
163 memory selection circuit
170 package
171 lid glass
172 atmosphere
180 SPAR (avalanche photodiode)
181 micro lens
182 metal shield
183 silicon substrate
184 $p^+$ diffusion layer
185 n-type diffusion layer
190 SPAD control unit
191 photon detection signal generation unit
192 first inverter
193 second inverter
194 delay circuit
195 NOR circuit
196 pixel signal output circuit
197 signal line driving circuit
198 signal line reset circuit
199 delay circuit
200 signal line pull-down circuit
201, 201a, 201b, 201c row selection switch
210 time switch
211 output switch
400 external system
Px(i,j) pixel
Mx(j), Mxa(j), Mxb(j), Mxc(j) pixel storage element
Bx(j), Bxa(j), Bxb(j), Bxc(j) buffer memory
Lx(j), Lxa(j), Lxb(j), Lxc(j) signal line
R(i), Ra(i), Rb(i), Rc(i) row selection line
Rm($\alpha$), Rma($\alpha$), Rmb($\alpha$), Rmc($\alpha$) memory selection line
C(j), Ca(j), Cb(j), Cc(j) column signal line
DS signal processing circuit
S1, S2 to S$\gamma$ signal line switching transistor
T1, T2 to T$\gamma$ storage element switching signal
BC1, BC2 to BC$\gamma$ binary counter
$\Delta T$ light emission time (full width at half maximum) of pulse light
$\Delta T1$, $\Delta T2$ to $\Delta T\gamma$ time width in which signal line switching transistor is turned on
NC1($t$), NC2($t$) to NC$\gamma$(t) count value of each binary counter at time t, NC11($t$), NC12($t$) to NC1$\gamma$($t$) count value of binary counter of Bxa(j) at time t
NC21($t$), NC22($t$) to NC2$\gamma$($t$) count value of binary counter of Bxb(j) at time t
NC31($t$), NC3($t$) to NC3$\gamma$($t$) count value of binary counter of Bxc(j) at time t

The invention claimed is:

1. A three-dimensional image element comprising:
a light receiving unit in which pixels each including an avalanche photodiode that detects light in a Geiger mode are arranged in a two-dimensional matrix pattern;
a pixel storage element to which an electrical pulse is supplied from each of the pixels that constitute a column of the pixels; and
a signal processing circuit that reads data accumulated by the pixel storage element and acquires, for each of the pixels, at least distance information indicating a distance to an object, wherein
the pixel storage element has a plurality of binary counters that integrate the number of electrical pulses at mutually different timings, and
the reading of the data by the signal processing circuit is able to be performed in parallel with the integration.

2. The three-dimensional image element according to claim 1, wherein the number of columns of the pixels in the light receiving unit is larger than the number of rows of the pixels in the light receiving unit.

3. The three-dimensional image element according to claim 1, wherein the light receiving unit, the pixel storage element, and the signal processing circuit are formed on a silicon substrate in a monolithic manner.

4. The three-dimensional image element according to claim 1, wherein each of the pixels includes a plurality of avalanche photodiodes that detect light in a Geiger mode.

5. The three-dimensional image element according to claim 1, wherein the number of bits of a digital signal processed by the signal processing circuit is equal to or more than a maximum number of output bits of each of the plurality of binary counters.

6. An optical radar device that includes the three-dimensional image element according to claim 1, the optical radar device comprising:
    a pulse light illumination system that has a light emitting element that emits pulse light, an optical scanning unit that performs scanning with the pulse light in a direction parallel to a first plane, and an optical conversion unit that converts the pulse light into fan-like pulse light that is spread in a direction vertical to the first plane; and
    an imaging optical system that images and projects light, which is from at least a part of a region to which light is radiated from the pulse light illumination system, onto the light receiving unit of the three-dimensional image element through an optical band-pass filter.

7. The optical radar device according to claim 6, wherein a spread angle of the fan-like pulse light in a fan plane is greater than an angle of the scanning.

8. The optical radar device according to claim 6, wherein the first plane is a plane including a vertical line.

9. The optical radar device according to claim 6, wherein a time width in which at least one of the binary counters of the three-dimensional image element integrates the number of electrical pulses is almost identical with a pulse width of the pulse light or shorter than the pulse width of the pulse light.

10. The optical radar device according to claim 6, wherein at least one of the binary counters of the three-dimensional image element integrates the number of electrical pulses before light emission of the pulse light.

11. The optical radar device according to claim 6, wherein the three-dimensional image element is able to output, in addition to the distance information, an intensity signal of reflection light obtained when radiation light from the pulse light illumination system is reflected by the object and an intensity signal of light that does not include the reflection light.

12. The optical radar device according to claim 6, wherein the optical radar device has a function of storing order of the scanning, causing the optical scanning unit to perform scanning with the pulse light in accordance with the stored order, and synchronously performing reading on the pixels in a corresponding row.

13. An optical radar device comprising:
    a pulse light illumination system that has a light emitting element that emits pulse light, an optical scanning unit that performs scanning with the pulse light in a direction parallel to a first plane, and an optical conversion unit that converts the pulse light into fan-like pulse light that is spread in a direction vertical to the first plane; and
    an imaging optical system that images and projects light, which is from at least a part of a region to which light is radiated from the pulse light illumination system, onto a light receiving unit of a sensor, which measures at least a distance to an object, through an optical band-pass filter.

14. The optical radar device according to claim 13, wherein a spread angle of the fan-like pulse light in a fan plane is greater than an angle of the scanning.

15. The optical radar device according to claim 13, wherein the first plane is a plane including a vertical line.

16. The optical radar device according to claim 13, wherein the sensor is able to output, in addition to the distance information, an intensity signal of reflection light obtained when radiation light from the pulse light illumination system is reflected by the object and an intensity signal of light that does not include the reflection light.

17. The optical radar device according to claim 13, wherein the optical radar device has a function of storing order of the scanning, causing the optical scanning unit to perform scanning with the pulse light in accordance with the stored order.

18. The optical radar device according to claim 13, wherein the optical radar device has a function to measure a distance of an object at a close distance firstly and then a whole object later.

19. The optical radar device according to claim 13, wherein the optical radar device has a function to measure a distance of an object with reduced intensity of the pulse light firstly and then with higher intensity than the reduced intensity later.

20. The optical radar device according to claim 13, wherein the sensor has a signal storage processing unite in addition to the light receiving unit, and the signal storage processing unite includes a plural of pixel storage elements, a buffer memory, a memory selection circuit and a signal processing circuit.

* * * * *